US009117836B2

(12) United States Patent
Tega et al.

(10) Patent No.: US 9,117,836 B2
(45) Date of Patent: Aug. 25, 2015

(54) SILICON CARBIDE SEMICONDUCTOR DEVICE AND MANUFACTURING METHOD THEREOF

(75) Inventors: Naoki Tega, Kunitachi (JP); Yasuhiro Shimamoto, Tokorozawa (JP); Yuki Mori, Tokyo (JP); Hirotaka Hamamura, Kodaira (JP); Hiroyuki Okino, Kokubunji (JP); Digh Hisamoto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 739 days.

(21) Appl. No.: 13/349,430

(22) Filed: Jan. 12, 2012

(65) Prior Publication Data

US 2012/0217513 A1   Aug. 30, 2012

(30) Foreign Application Priority Data

Feb. 28, 2011   (JP) ................. 2011-041091

(51) Int. Cl.
*H01L 21/28*   (2006.01)
*H01L 29/66*   (2006.01)
(Continued)

(52) U.S. Cl.
CPC ...... *H01L 29/66068* (2013.01); *H01L 21/0475* (2013.01); *H01L 21/0485* (2013.01); *H01L 29/45* (2013.01); *H01L 29/7802* (2013.01); *H01L 29/7813* (2013.01);
(Continued)

(58) Field of Classification Search
CPC .............. H01L 29/45; H01L 29/66068; H01L 29/7802; H01L 29/7813; H01L 21/0485; H01L 21/0475; H01L 29/1608; H01L 29/42372; H01L 29/42376; H01L 29/518; H01L 29/513; H01L 29/4238

USPC ............................................. 257/77, E29.068
See application file for complete search history.

(56) References Cited

U.S. PATENT DOCUMENTS 6,825,105 B2   11/2004   Grover et al.
7,141,498 B2   11/2006   Malhan et al.
(Continued)

FOREIGN PATENT DOCUMENTS

JP   05-055587 A    3/1993
JP   2001-274141 A  10/2001
(Continued)

OTHER PUBLICATIONS

Office Action issued Jul. 30, 2013 in Japanese Patent Application No. 2011-041091.
(Continued)

*Primary Examiner* — Ermias Woldegeorgis
(74) *Attorney, Agent, or Firm* — Miles & Stockbridge P.C.

(57) ABSTRACT

A SiC MOSFET has a subject that resistance in the source region is increased when annealing for metal silicidation is performed to a source region before forming the gate insulating film, the metal silicide layer of the source region is oxidized by an oxidizing treatment (including oxynitriding treatment) when the gate insulating film is formed. When a metal silicide layer to be formed on the surface of a SiC epitaxial substrate is formed before forming a gate insulating film interface layer (oxide film), and an anti-oxidation film for the metal silicide is formed on the metal silicide layer, it is possible to suppress oxidation of the metal silicide layer by the oxidizing treatment upon forming the gate insulating film interface layer and the resistance of the source region can be decreased without lowering the channel mobility.

5 Claims, 27 Drawing Sheets

(51) Int. Cl.
  *H01L 29/45* (2006.01)
  *H01L 29/78* (2006.01)
  *H01L 21/04* (2006.01)
  *H01L 29/16* (2006.01)
  *H01L 29/423* (2006.01)
  *H01L 29/51* (2006.01)

(52) U.S. Cl.
  CPC ........ *H01L 29/1608* (2013.01); *H01L 29/4238* (2013.01); *H01L 29/42372* (2013.01); *H01L 29/42376* (2013.01); *H01L 29/513* (2013.01); *H01L 29/518* (2013.01)

(56) References Cited

U.S. PATENT DOCUMENTS

| | | | |
|---|---|---|---|
| 7,544,568 B2 * | 6/2009 | Matsuura et al. | 438/259 |
| 2009/0050898 A1 * | 2/2009 | Tanimoto et al. | 257/77 |
| 2009/0209090 A1 * | 8/2009 | Yokoyama et al. | 438/476 |
| 2010/0314694 A1 | 12/2010 | Mayuzumi et al. | |

FOREIGN PATENT DOCUMENTS

| | | |
|---|---|---|
| JP | 2004-522319 A | 7/2004 |
| JP | 2005-101147 A | 4/2005 |
| JP | 2006-024880 A | 1/2006 |
| JP | 2006-261624 A | 9/2006 |
| JP | 2007-180118 A | 7/2007 |
| JP | 2009-177102 A | 8/2009 |
| JP | 2010-287760 A | 12/2010 |

OTHER PUBLICATIONS

Tsunenobu Kimoto et al., "Interface Properties of Metal-Oxide-Semiconductor Structures on 4H—SiC{0001} and (1120) Formed by $N_2O$ Oxidation" Japanese Journal of Applied Physics, vol. 44, No. 3, 2005, pp. 1213-1218.

Office Action dated Feb. 25, 2014, in Japanese Patent Application No. 2011-041091.

* cited by examiner

SILICON CARBIDE SEMICONDUCTOR DEVICE AND MANUFACTURING METHOD THEREOF

CLAIM OF PRIORITY

The present application claims priority from Japanese patent application JP 2011-041091 filed on Feb. 28, 2011, the content of which is hereby incorporated by reference into this application.

FIELD OF THE INVENTION

The present invention concerns a silicon carbide semiconductor device provided on a silicon carbide semiconductor substrate and a manufacturing method thereof.

BACKGROUND OF THE INVENTION

With an aim of utilizing energy at high efficiency, conversion of a material from Si (silicon) to SiC (silicon carbide) has now been under consideration for power MOSFETs (Metal Oxide Semiconductor Field Effect Transistors). This is because SiC is a semiconductor having an dielectric breakdown field strength about seven times and a forbidden band gap about three times as much as those of Si, and is suitable to power MOSFETs capable of operation with less loss and at high temperature.

In recent years, development of SiC MOSFETs has been progressed and a low on-resistance below 10 mΩcm$^2$ at a 600 to 1200 V withstanding voltage is obtained. This is sufficiently low compared with that of Si IGBT (Insulated Gate Bipolar Transistor) or Si super junction MOSFET at an identical withstanding voltage. However, in view of intrinsic characteristics to be obtained from the SiC semiconductor, the on-resistance can be further decreased.

One of the subjects concerning the on-resistance of the SiC MOSFET is high channel resistance inherent to SiC. Generally, crystals of 4H—SiC having a Si face on the surface are used for a substrate. In a DMOSFET (Double-Diffused MOSFET) using the Si face as a channel and forming a gate insulating film by dry oxidation or wet oxidation, the mobility is 10 cm$^2$/Vs or less (for example, refer to T. Kimoto et al., "Interface Properties of Metal-Oxide-Semiconductor Structures on 4H—SiC {0001} and (11-20) Formed by N$_2$O Oxidation", Japanese Journal of Applied Physics, Vol. 44, pp. 1213-1218, 2005). This is because the interface state between a SiC substrate and a gate insulating film is from 10$^{12}$ to 10$^{13}$ cm$^{-2}$ eV$^{-1}$ which is higher by two digits or more than Si. The low mobility increases the channel resistance and, as a result, hinders decrease in the on-resistance.

Generally, it has been known that JFET (Junction FET) resistance or accumulation resistance can be decreased by changing the device structure from a DMOSFET to a trench MOSFET and the mobility can be improved further in SiC by utilizing the A face as a face vertical to the Si face as a channel (for example, refer to T. Kimoto et al., "Interface Properties of Metal-Oxide-Semiconductor Structures on 4H—SiC {0001} and (11-20) Formed by N$_2$O Oxidation", described above. In this case, a mobility of 50 cm$^2$/Vs or more can be expected. Accordingly, by adopting the trench MOSFET for the SiC semiconductor, the mobility is improved and the channel resistance can be decreased.

Further, since the channel can be vertical to the substrate in the trench MOSFET, this is advantageous in view of, the integration degree compared with the DMOSFET where the channel is horizontal to the substrate and, as a result, it can be expected that the channel resistance is decreased further.

A manufacturing method disclosed in Japanese Unexamined Patent Application Publication (Translation of PCT Application) No. 2004-522319 has been known as a method of manufacturing a trench MOSFET in the Si semiconductor. In this method, a silicide for obtaining a good low resistance contact with a source electrode is formed in a source region after forming a dielectric layer (gate insulating film) to the wall of the trench.

Further, a manufacturing method disclosed in Japanese Unexamined Patent Application Publication No. 2006-261624 has been known as a method of manufacturing a silicon carbide device. In this method, for suppressing a thermal load on the semiconductor-gate oxide film interface in a high temperature treatment accompanying ion implantation or annealing for connection metal, a silicide is formed before forming the gate insulating film.

SUMMARY OF THE INVENTION

According to the inventors' study the following three subjects have been found. The first subject is to be described. At first, when the manufacturing method of Japanese Unexamined Patent Application Publication (Translation of PCT Application) No. 2004-522319 is applied to a SiC MOSFET, a high temperature of 1000° C. or higher is necessary in annealing for silicidation in SiC, different from Si, and the interface layer between the SiC and the gate insulating film is remarkably deteriorated by the high temperature heat treatment. This remarkably decreases the channel mobility. This is because SiOC is formed in the interface layer by the heat treatment at high temperature to form electron traps. On the other hand, while the manufacturing method of Japanese Unexamined Patent Application Publication No. 2006-261624 can overcome the subject, since the silicide layer itself is removed after forming the silicide film for taking ohmic connection at a low temperature, when it is considered to form a contact plug to a source region is considered, contact cannot be taken again in one identical region and the resistance in the source region is remarkably increased compared with a case of not removing the silicide layer. In a case where the silicide layer is not removed, the present inventors have found a subject that the surface of the silicide layer is oxidized in the step of forming the gate insulating film interface layer as the gate insulating film and the resistance is increased in the source region due to the reduction of the thickness of the silicide layer rather than the subject of metal contamination where the silicide layer is left. That is, the first subject is that in the resistance of the source region is increased.

Then, the second subject is to be described. In a device of forming a silicide layer in a source region, forming a silicon oxide film directly thereon, and forming a contact hole in the silicon oxide film, the present inventors have found a subject that oxygen in the silicon oxide film oxidizes the silicide layer due to the heat generated by an electric current that drives the device thereby causing degradation in the silicide layer. The deterioration increases the resistance in the source region to result in lowering of the reliability or the life of the device. That is, the second subject is the aging deterioration of the silicide layer.

Finally, the third subject is to be described. The manufacturing method of Japanese Unexamined Patent Application Publication (Translation of PCT Application) No. 2004-522319 discloses a process of completely filling the gate electrode inside the trench by etching back the gate electrode. However, since the gate electrode extends in the direction of the depth, reduction of the cross sectional area of the gate electrode increases the resistance of the gate electrode to lower the switching speed of the MOSFET. On the other hand, when a process of leaving a portion of the gate electrode on the surface of the substrate is adopted, since the portion of the gate electrode remains on the surface of the substrate, it is actually difficult to bring the silicide layer formed subsequently close to the channel region. This is because a self-alignment process is used in the formation of the silicide layer. Therefore, decrease in the resistance of the source region is limited in the process of leaving a portion of the gate electrode on the surface of the substrate. As described above, there is a trade off relation between the decrease in the resistance for the gate electrode and decrease in the resistance for the source region, and it is difficult to decrease the resistance of the gate electrode and that of the source region compatibly. That is, the third subject to attain compatible decrease between the resistance of the gate electrode and that of the source electrode.

Typical inventions of the present application are to be described below.

According to one aspect of the present inventions, a method of manufacturing a silicon carbide semiconductor device includes: a first step of forming multiple metal silicide layers spaced apart from each other over a silicon carbide semiconductor layer, a second step of forming an anti-oxidation film for the metal silicide layer over the silicon carbide semiconductor layer, a third step of removing a portion of the anti-oxidation film between each of the metal silicide layers, a fourth step of forming an oxide film by oxidizing the surface of the silicon carbide semiconductor layer in a region where the anti-oxidation film has been removed, and a fifth step of forming a gate electrode of a MOSFET over the oxide film. This can overcome the first subject.

According to another aspect of the present invention, a silicon carbide semiconductor device includes: a silicon carbide semiconductor layer formed over a silicon carbide substrate, multiple metal silicide layers formed while being spaced apart from each other over the silicon carbide semiconductor layer, a contact plug formed over the metal silicide layer, an anti-oxidation film for the metal silicide layer formed over the metal silicide layer excepting a region where the contact plug has been formed, a silicon oxide film formed over the anti-oxidation film, a gate electrode for a MOSFET formed between each of the multiple metal silicide layers, and a drain electrode of a MOSFET formed on the surface opposite to the surface where the silicon carbide semiconductor layer of the silicon carbide substrate is formed. This can overcome the second subject.

According to still another aspect of the present invention, a silicon carbide semiconductor device includes: a silicon carbide semiconductor layer formed over a silicon carbide substrate, multiple metal silicide layers formed while being spaced apart from each other over the silicon carbide semiconductor layer, a gate electrode of a MOSFET buried in a trench formed to the silicon carbide substrate between each of the metal silicide layers, a gate insulating film formed between the gate electrode and the silicon carbide semiconductor layer, and a drain electrode of the MOSFET formed to the surface of the silicon carbide substrate opposite to the surface where the silicon carbide semiconductor layer is formed, in which the gate electrode has a portion wider than the trench at the outside of the trench, and formed such that the end of the metal silicide layer is nearer to the gate insulating film than the end of the wider portion. This can overcome the third subject.

According to the aspects of the present invention, there can be provided a method of manufacturing a silicon carbide semiconductor device capable of decreasing the resistance of the source region without lowering the channel mobility. Further, there can be provided a silicon carbide semiconductor device capable of suppressing lowering of the reliability and the life of the device by suppressing the deterioration of the silicide layer. Further, there can be provided a silicon carbide semiconductor device capable of compatibly decreasing the resistance for the gate electrode and for the source region.

BRIEF DESCRIPTION OF THE DRAWINGS

FIG. 4O is a cross sectional view of a step showing the step succeeding to FIG. 4N.

DETAILED DESCRIPTION OF THE PREFERRED EMBODIMENTS

First Embodiment

Figure 1:
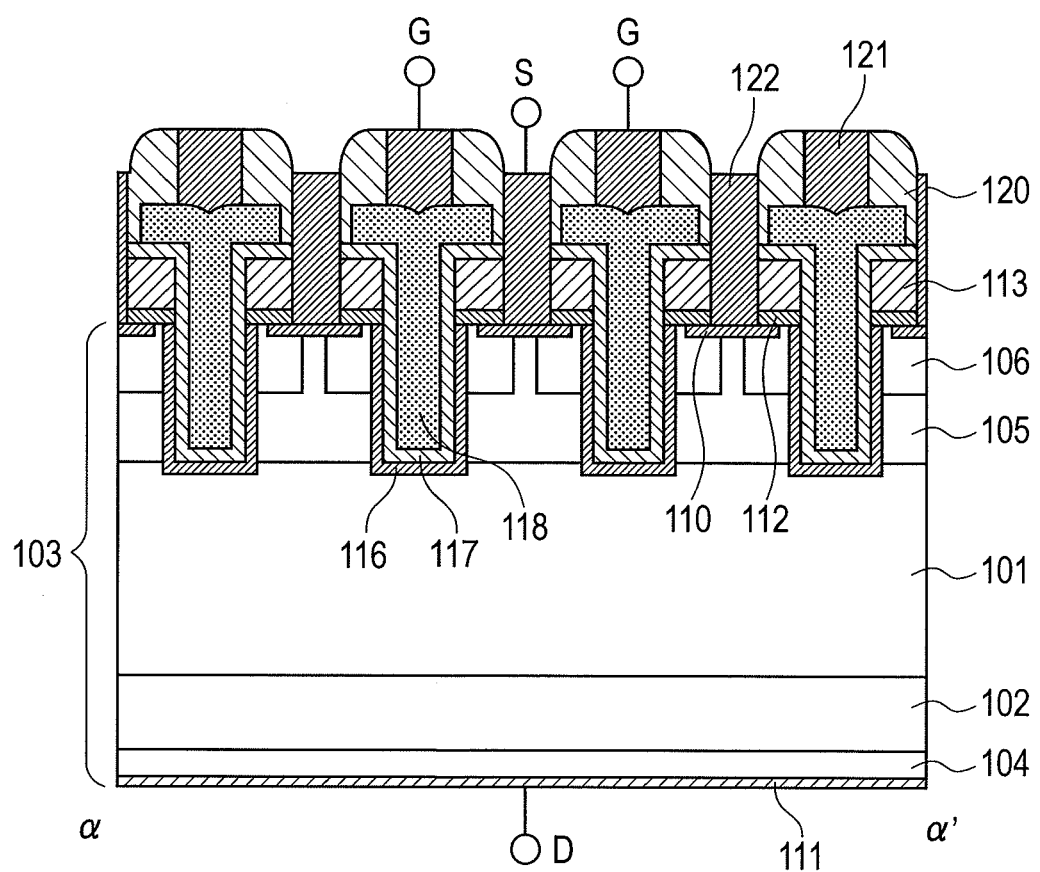
FIG. 1 is a cross sectional view of a SiC semiconductor device according to a first embodiment of the present invention.

A first embodiment of the present invention is to be described in details with reference to the drawings. FIG. 1 is a schematic cross sectional view of a SiC (silicon carbide) semiconductor device according to the first embodiment of the invention. The SiC semiconductor device has a structure in which multiple unit cells of trench MOSFETs are arranged. FIG. 1 shows a portion of the multiple unit cells. 102 denotes a SiC substrate and a SiC epitaxial substrate 103 comprises the SiC substrate 102 and an epitaxial layer 101 formed over the SiC substrate 102. A body layer 105 forming the channel region of the MOSFET and a source diffusion layer region 106 forming the source region of the MOSFET are formed to the epitaxial layer 101 on the side of the substrate surface. A drain diffusion layer region 104 forming the drain region of the MOSFET is formed at the rearface of the SiC substrate 102. 118 denotes a gate electrode of the MOSFET, 117 denotes a gate insulating film interface layer between the gate insulating film and the SiC layer. 110 denotes a metal silicide layer for the source region and 111 denotes a metal silicide layer for the drain region. 112 denotes an anti-oxidation film (for example, silicon nitride film) disposed for preventing oxidation for the surface of the metal silicide layer. 113 denotes a silicon oxide film formed on the anti-oxidation film. 121 and 122 denote, respectively, a wiring electrode (contact plug) for the gate electrode and a wiring electrode (contact plug) for the source region. The electrodes 121 and 122 are electrically connected respectively to electrode pads applied with a gate potential (G) and a source potential (S) supplied from the outside in the same manner as the central portion in the drawing, in which a drain electrode (D) supplied from the outside is applied to the metal silicide layer 111. 120 denotes an interlayer insulating film (for example, silicon oxide film).

Figure 2A:
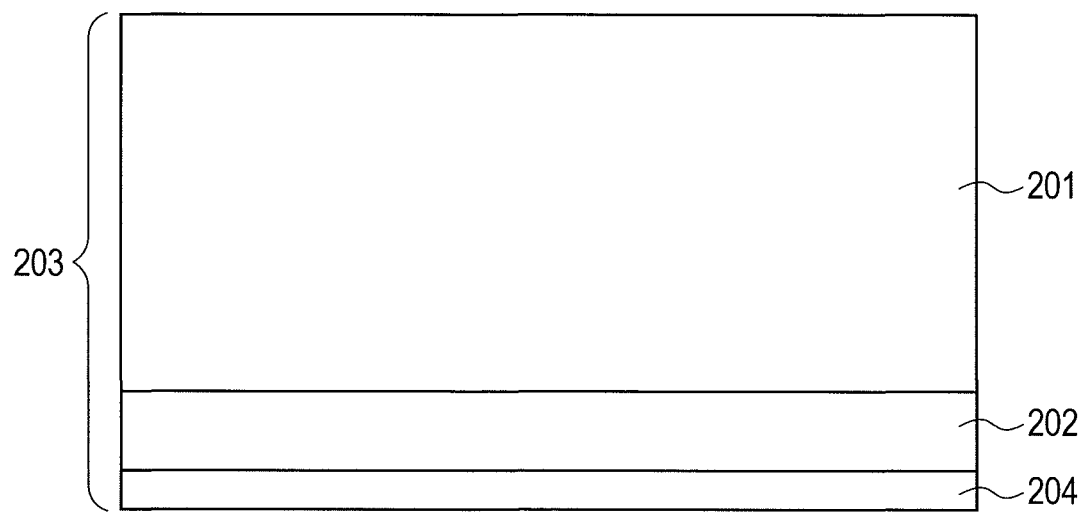
FIG. 2A is a cross sectional view of a step for explaining a method of manufacturing the SiC semiconductor device shown in FIG. 1.
Figure 2B:
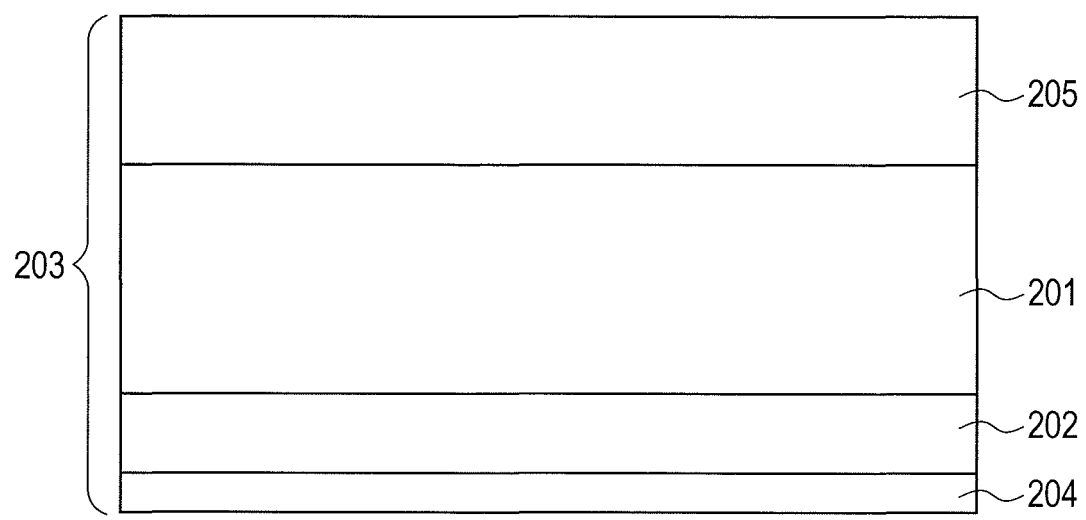
FIG. 2B is a cross sectional view of a step showing the step succeeding to FIG. 2A.
Figure 2C:
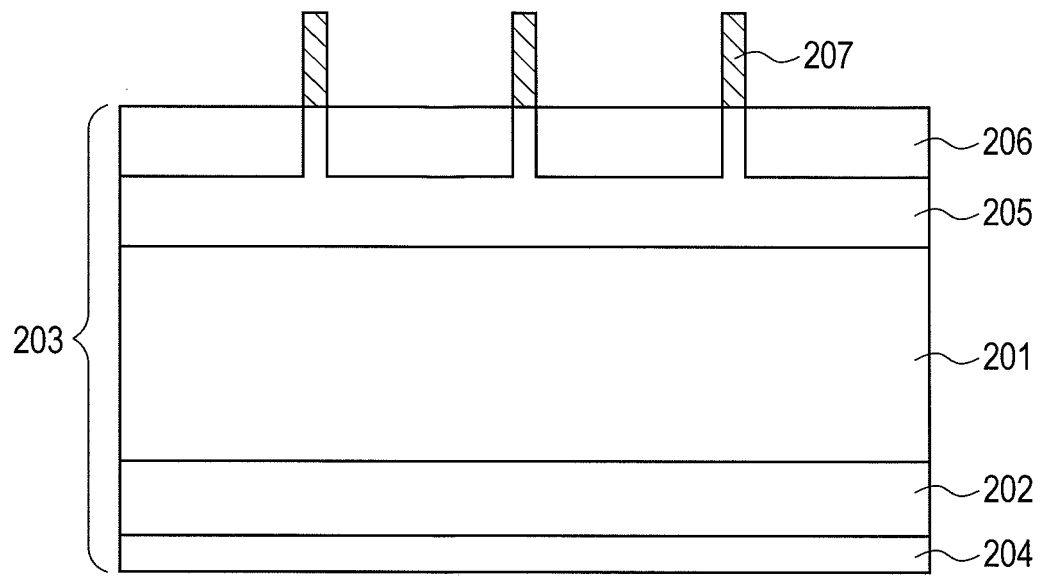
FIG. 2C is a cross sectional view of a step showing the step succeeding to FIG. 2B.
Figure 2D:
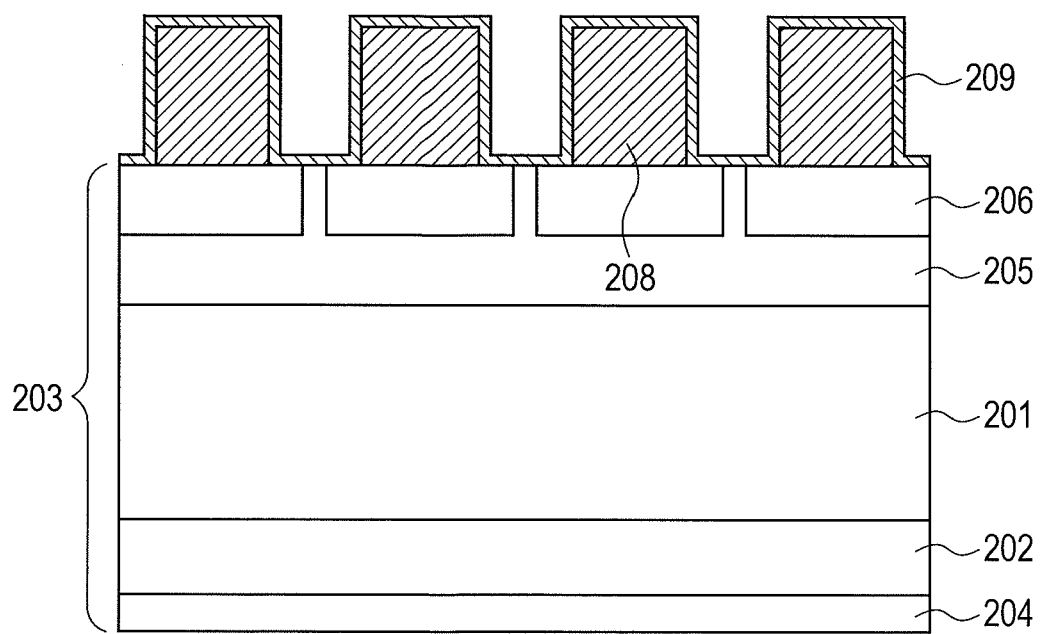
FIG. 2D is a cross sectional view of a step showing the step succeeding to FIG. 2C.
Figure 2E:
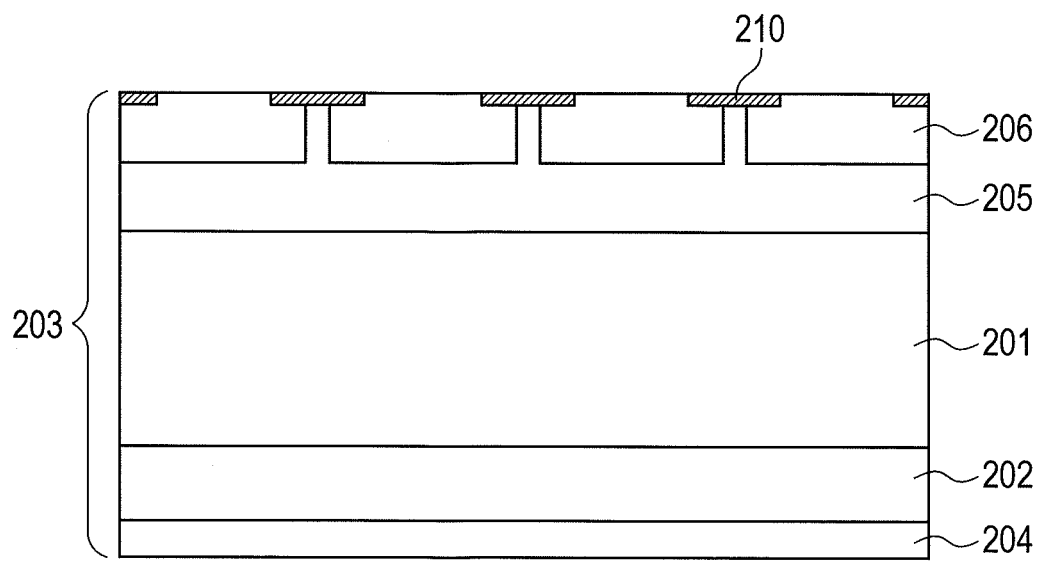
FIG. 2E is a cross sectional view of a step showing the step succeeding to FIG. 2D.
Figure 2F:
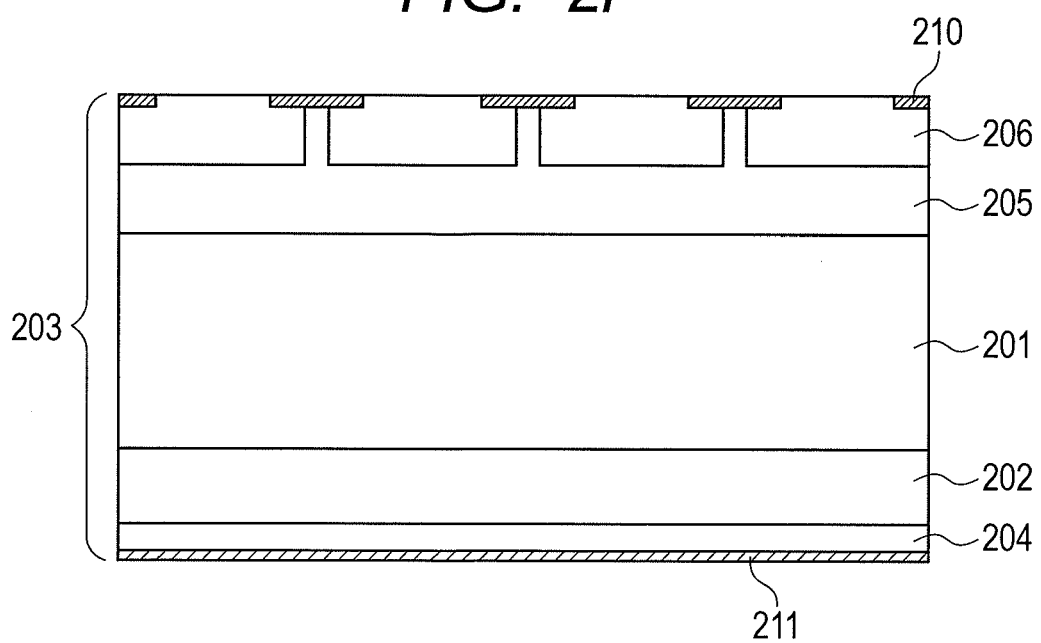
FIG. 2F is a cross sectional view of a step showing the step succeeding to FIG. 2E.

A method of manufacturing a SiC semiconductor device in the first embodiment of the invention shown in FIG. 1 is to be described with reference to FIG. 2A to FIG. 2O. The manufacturing method can decrease the resistance of a source region without lowering the channel mobility by forming the metal silicide layer 110 and the silicon nitride film 112 before forming the gate insulating film 117.

At first, the SiC semiconductor device is disposed over a 4H—SiC substrate 202. A N-type impurity is implanted into the SiC substrate 202. The impurity is, for example, nitrogen and the impurity concentration is in a range, for example, from $1\times10^{18}$ to $1\times10^{21}$ cm$^{-3}$. Further, the surface of the SiC substrate 202 may be either a Si face or a C (carbon) face.

Over the SiC substrate 202, a N$^-$ type epitaxial layer 201 comprising SiC implanted with the N-type impurity at a concentration lower than that of the SiC substrate 202 is epitaxially grown over the SiC substrate 202. The impurity concentration of the N$^-$ type epitaxial layer 201 depends on the device rating of the SiC semiconductor device 1 and is, for example, in a range from $1\times10^{15}$ to $1\times10^{17}$ cm$^{-3}$ (FIG. 2A). By way of the steps described above, a SiC epitaxial substrate 203 is completed. Then, a N$^+$ type diffusion layer region 204 as a drain is disposed to the rearface of the SiC epitaxial substrate 203. The impurity concentration is preferably at a high concentration, for example, in a range from $1\times10^{19}$ to $1\times10^{21}$ cm$^{-3}$ (FIG. 2A).

Then, a body layer 205 is formed. At first, a positive resist is coated, exposed, and developed to form a resist pattern of a desired shape of the body layer (not illustrated). Successively, a P-type body layer 205 is formed by ion implantation. The impurity is, for example, aluminum. The impurity concentration is in a range, for example, from $1\times10^{16}$ to $1\times10^{19}$ cm$^3$ (FIG. 2B). The depth of the body layer 205 is preferably about 1 μm. Then, a N$^+$ type diffusion layer region 206 as a source is disposed (FIG. 2C). At first, a photoresist is coated, exposed, and developed to form a resist pattern 207 of a desired shape of the diffusion layer region. Successively, ions are implanted. The impurity is, for example, nitrogen. It is preferred that the impurity concentration is equal with or higher than the concentration in the N$^+$ type diffusion layer region 204. For example, it is a range from $1\times10^{19}$ to $1\times10^{21}$ cm$^{-3}$. After implanting the impurity and removing the resist pattern 207, implanted impurity is activated. The heat treatment of activating SiC requires a temperature of 1500° C. or higher. However, if it exceeds 1500° C. or higher, Si atoms or implanted atoms detach from the SiC surface. Further, the surface planarity is deteriorated. Then, the surface and the rearface of the SiC epitaxial substrate 203 are coated with a carbon film (not illustrated) before the heat treatment for activation. The carbon film is deposited to the surface and the rearface of the SiC epitaxial substrate 203 to about 30 nm by a plasma CVD apparatus. After coating the carbon film, heat treatment for activation is performed at a high temperature of 1500° C. or higher for several minutes. After the heat treatment for activation, the coated carbon film is removed by an oxygen plasma treatment (not illustrated). After removing the carbon film, the surface of the SiC epitaxial substrate 203 deteriorated under the effect of the heat treatment for activation and the carbon film is removed by sacrificial oxidation (not illustrated). As a sacrificial oxidation film, a silicon oxide film containing about 10 nm of residual carbon is formed as a sacrificial oxide film by dry oxidation at 1100° C. and is removed with HF diluted to a 1/10 concentration.

Then, a metal silicide layer is formed to a portion of the N+ type diffusion layer region 206 and the body layer 205. At first, an $SiO_2$ film (silicon oxide film) 208 is deposited on the surface of the SiC epitaxial substrate 203 by a plasma CVD apparatus (FIG. 2D). The $SiO_2$ thickness is about 500 nm. Successively, a portion for forming a metal silicide layer is apertured. At first, a photoresist is coated, exposed, and developed to obtain a desired resist pattern (not illustrated). Then, patterned $SiO_2$ film is formed over the SiC epitaxial substrate 203 by dry etching of the $SiO_2$ film 208 (FIG. 2D). After pre cleaning for 30 sec. with HF diluted to 1/100 concentration, a metal film 209 is deposited to about 20 nm to the surface of the SiC epitaxial substrate 203 by using a magnetron sputtering apparatus (FIG. 2D).

Then, annealing for silicidation is performed at 800° C., so that and the metal film 209 and the SiC epitaxial substrate 203 are reacted to form a metal silicide layer 210 (FIG. 2E) In this step, the metal silicide layer 210 show a Schottky characteristic. After forming metal silicide layer 210, an unreacted metal film is removed by using wet etching, and the $SiO_2$ film 208 is removed with HF diluted to 1/10 concentration. In wet etching for removing the metal film, a sulfuric acid/hydrogen peroxide mixture is used for instance. By the way of the steps described above, the metal silicide layer 210 is fabricated into a desired shape and multiple metal silicide layers separated from each other are formed over the SiC semiconductor layer (FIG. 2E).

Then, a metal silicide layer 211 is formed so as to cover the N+ type diffusion layer 204 at the rearface. At first, after pre-cleaning with HF diluted to 1/100 concentration for 30 sec, a metal film (not illustrated) is deposited by about 100 nm to the rearface of the SiC epitaxial substrate 203 by using a magnetron sputtering apparatus. Then, annealing for silicidation at 1000° C. was performed and the metal film and the SiC epitaxial substrate 203 are reacted to form a metal silicide layer 211. At this step, the metal silicide layer 210 on the surface and the metal silicide layer 211 on the rearface show a good ohmic characteristic of 10 $\Omega cm^2$ or less. After forming the metal silicide layer 211, an unreacted metal film on the rearface is removed by using wet etching (FIG. 2F). As the metal material forming the metal silicide layers 210 and 211, a silicide film containing at least one member selected from the group consisting of nickel, cobalt, platinum, palladium, titanium, aluminum, molybdenum, and tungsten is used.

Figure 2G:
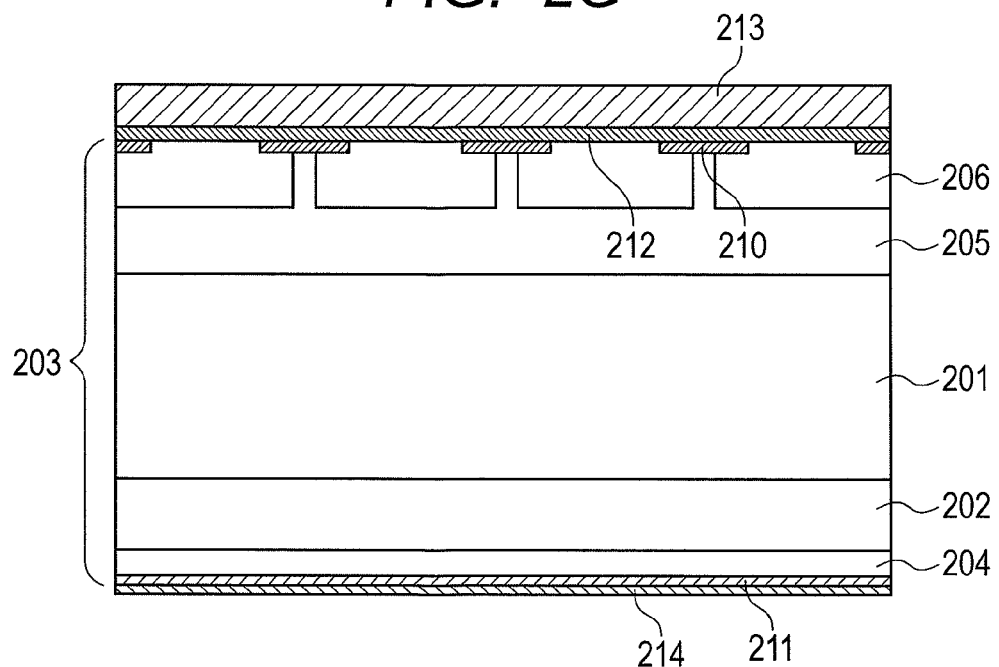
FIG. 2G is a cross sectional view of a step showing the step succeeding to FIG. 2F.

After forming the metal silicide layers 210 and 211 on the surface and the rearface of the SiC epitaxial substrate 203, a SiN (silicon nitride) film is formed as an anti-oxidation film 212 for metal silicide to about 50 nm on the surface by a plasma CVD apparatus (FIG. 2G). The anti-oxidation film 212 has an effect of preventing the oxidation of the surface of the metal silicide layer 210 and also an effect of preventing diffusion of a metal contained in the metal silicide layer. Successively, a $SiO_2$ film is formed as an insulating film 213 on the surface by a plasma CVD apparatus. The thickness of the $SiO_2$ film is about 300 nm (FIG. 2G). Then, SiN is formed as an anti-oxidation film 214 for the metal silicide to about 50 nm on the rearface of the SiC epitaxial substrate 203 by a plasma CVD apparatus in the same manner for the surface (FIG. 2G). The material suitable to the anti-oxidation films 212 and 214 for the metal silicide may be properly selected depending on the metal silicide material as the underlayer and thermal load to be applied after forming the metal silicide and is not restricted to the SiN film described above. For example, aluminum nitride, boron nitride, silicon carbide, etc. can be applied in this embodiment.

Figure 2H:
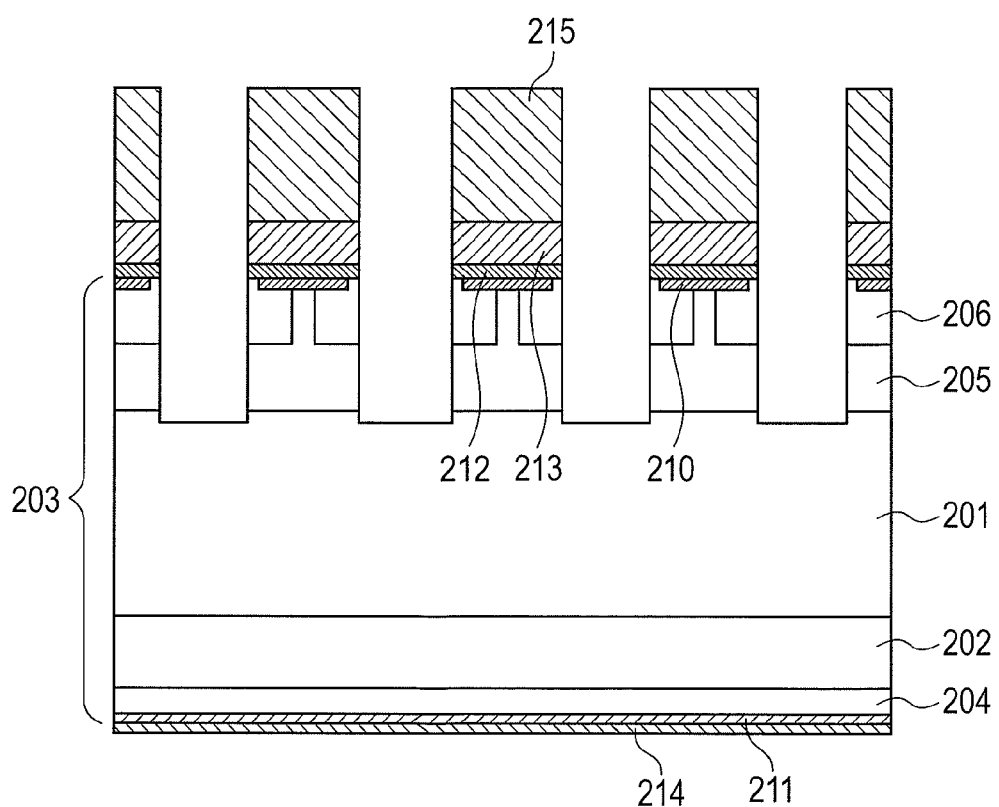
FIG. 2H is a cross sectional view of a step showing the step succeeding to FIG. 2G.

After forming the anti-oxidation film 214 for the metal silicide at the rearface, the insulating film 213 and the anti-oxidation film 212 are apertured and, further, the SiC epitaxial substrate 203 is etched till the body layer 205 is penetrated (FIG. 2H). The insulating film 213 and the anti-oxidation film 212 function as a mask upon etching. At first, a positive resist is coated, exposed, and developed to obtain a desired resist pattern 215 (FIG. 2H). Then, the insulating film 213 and the anti-oxidation film 212 are apertured by dry etching. Further, the SiC epitaxial substrate 203 is etched till the body layer 205 is penetrated. The depth of the trench is for example in a range from 1 to 2 µm (FIG. 2H). After forming the trench in the SiC epitaxial substrate 203, the trench surface deteriorated by dry etching (not illustrated) is removed by using sacrificial oxidation. Radical oxidation capable of isotropic oxidation is used and a silicon nitride film containing residual carbon of about 10 nm is formed as a sacrificial oxidation film (not illustrated). The substrate temperature is preferably 1000° C. or lower. The sacrificial oxidation film is removed with HF diluted to a 1/100 concentration.

Figure 2I:
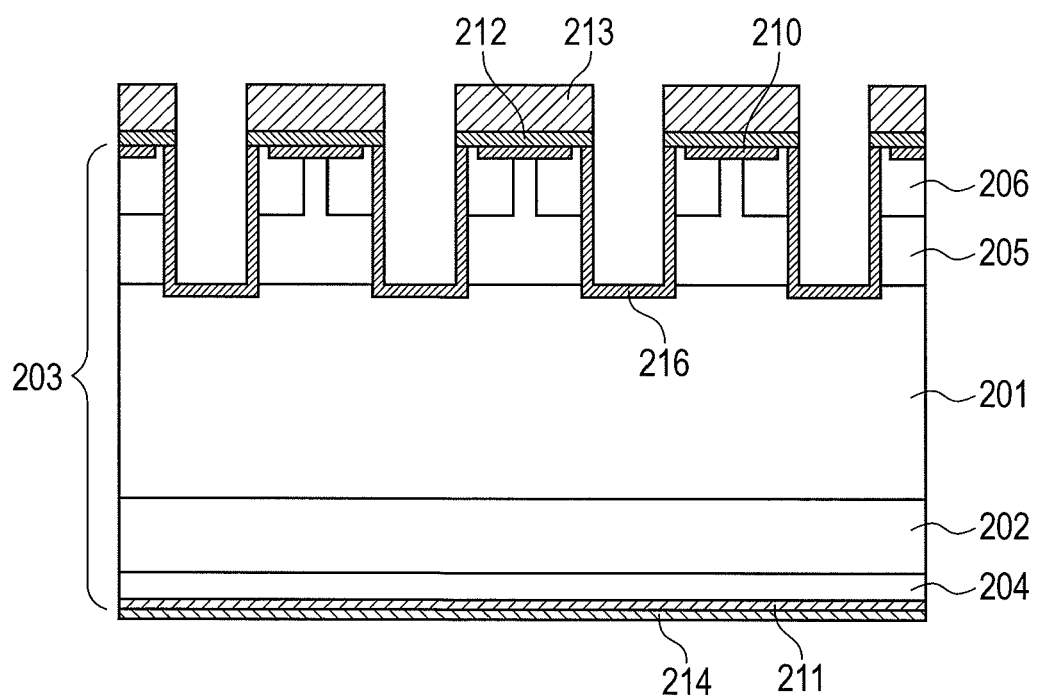
FIG. 2I is a cross sectional view of a step showing the step succeeding to FIG. 2H.

Successively, a gate insulating film interface layer 216 is formed by thermal oxidation at a substrate temperature of 1000° C. or higher. Preferably, after pre-cleaning with HF diluted to a 1/100 concentration for 30 sec, the gate insulating film interface layer 216 is formed by oxynitridation with NO or $N_2O$ (FIG. 2I). The substrate temperature in the oxynitridation treatment is preferably 1000° C. or higher and the thickness of the gate insulating interface layer 216 is preferably in a range from 1 to 5 nm. Thus, a thermal oxidation film containing nitrogen to form a portion of the gate insulating film is formed at the bottom and on the lateral sides of the trench. Further, the nitridation amount of the gate insulating film interface layer 216 as the thermal oxidation film is in a range from 0.1 to 10%. The gate insulating film interface layer 216 is an interface layer formed by oxidizing (also oxynitriding) the SiC surface. The method of forming the insulating film interface layer 216 may be properly selected in accordance with a threshold voltage of the SiC semiconductor element and is not restricted to NO or $N_2O$ described above. In this embodiment, wet oxidation, dry oxidation, radical oxidation, etc. can be used, for example, for forming the insulating film interface layer 216. Since the anti-oxidation film 212 is formed over the metal silicide layer 210, oxidation of the metal silicide layer 210 can be suppressed upon forming the gate insulating film interface layer 216.

Figure 2J:
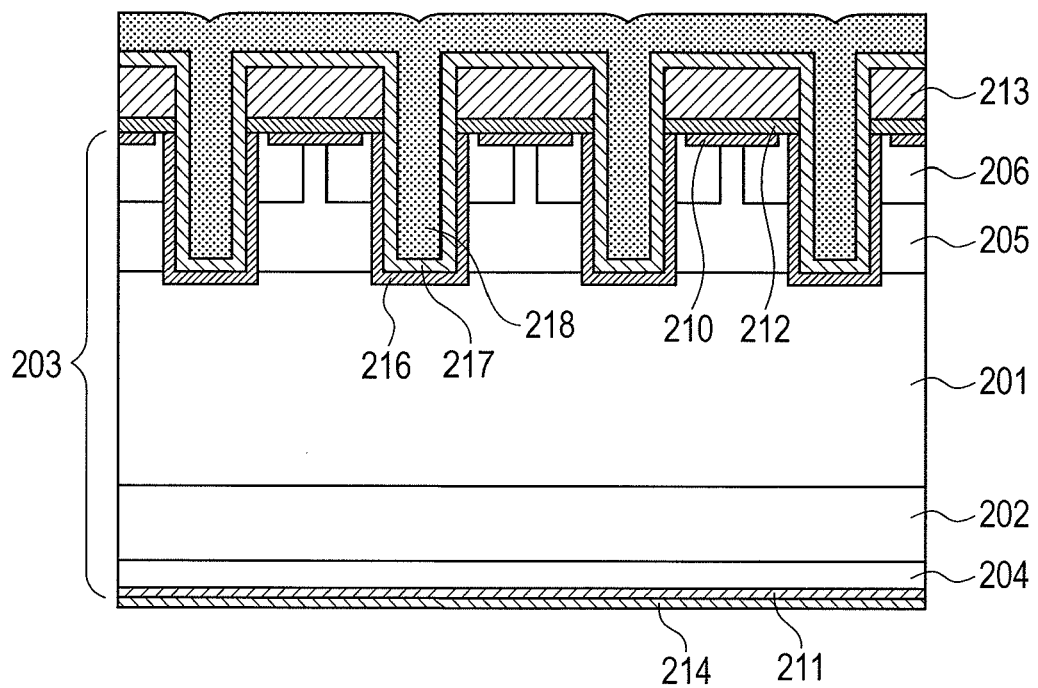
FIG. 2J is a cross sectional view of a step showing the step succeeding to FIG. 2I.

Then, a gate insulating film 217 is formed (FIG. 2J). The thickness of the gate insulating film 217 is in a range from 30 to 100 nm. The material forming the gate insulating film 217 is preferably a highly dielectric material having a specific dielectric constant of higher than that of $SiO_2$. For example, a highly dielectric material containing at least one member selected from $SiO_2$, aluminum oxide, hafnium oxide, zirconium oxide, and silicon nitride is desirable. As a method of forming the gate insulating film 217, vacuum CVD, ALD (Atom Layer Deposition method), MOCVD (organic metal vapor deposition), etc. are applied. The gate insulating film is formed at a substrate temperature of 800° C. or lower. This is for suppressing the formation of SiOC at the SiC layer interface in contact with the already formed oxide film (gate insulating film interface layer). After forming the gate insulating film 217, a gate electrode 218 is formed (FIG. 2J). The thickness of the gate electrode 218 is in a range from 100 to 200 nm. As the gate electrode material, polycrystal silicon or metal is preferred.

In a case where the gate electrode material comprises polycrystal silicon, it is formed by using a vacuum CVD apparatus. In this step, phosphorus is introduced as a dopant impurity in a range from $1\times10^{19}$ to $1\times10^{21}$ cm$^{-3}$. Further, for avoiding thermal load, it is preferably formed at a temperature lower than that in the step of forming the gate insulating film interface layer 216 and the gate insulating film 217. Specifically, the gate insulating film is formed at a substrate temperature of 800° C. or lower.

When the gate electrode material comprises a metal, the material forming the gate electrode 218 is selected, for example, from aluminum, tungsten, ruthenium, iridium, platinum, nickel, cobalt, molybdenum, palladium, titanium nitride, tantalum nitride, titanium carbide, and tantalum carbide. Further, for avoiding thermal load, in the same manner where the gate electrode material comprises polycrystal silicon, it is preferably formed at a temperature lower than that in the step for the gate insulating film interface layer 216 and the gate insulating film 217. Specifically, the gate electrode is formed at a substrate temperature of 800° C. or lower.

Figure 2K:
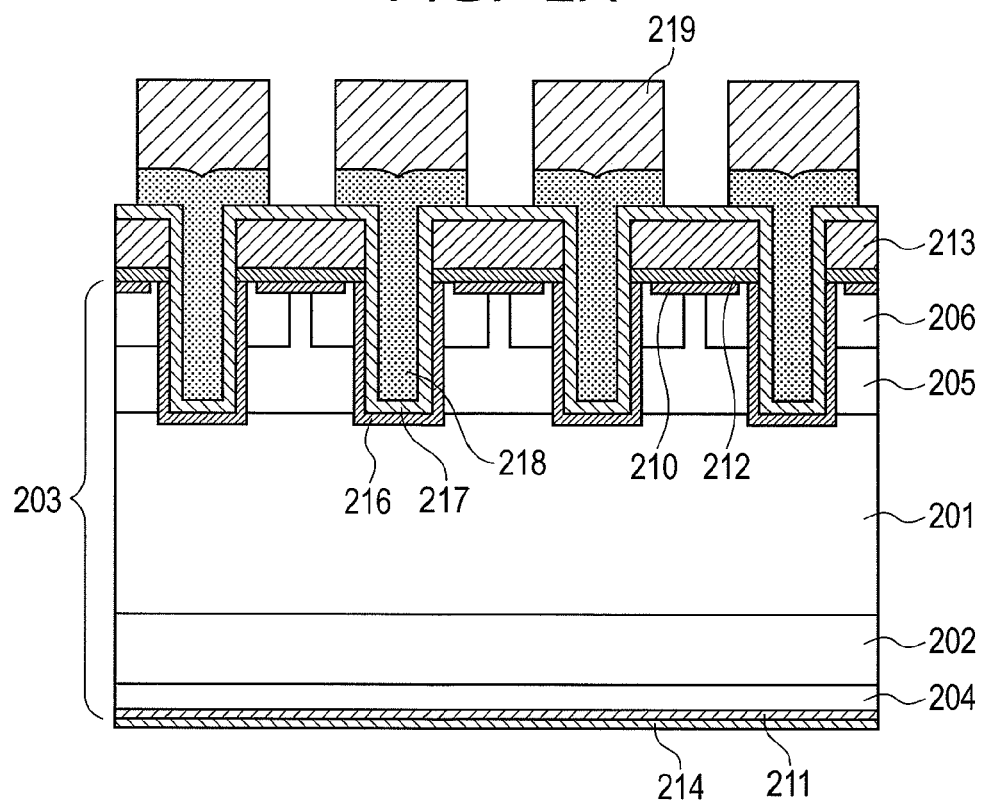
FIG. 2K is a cross sectional view of a step showing the step succeeding to FIG. 2J.
Figure 2L:
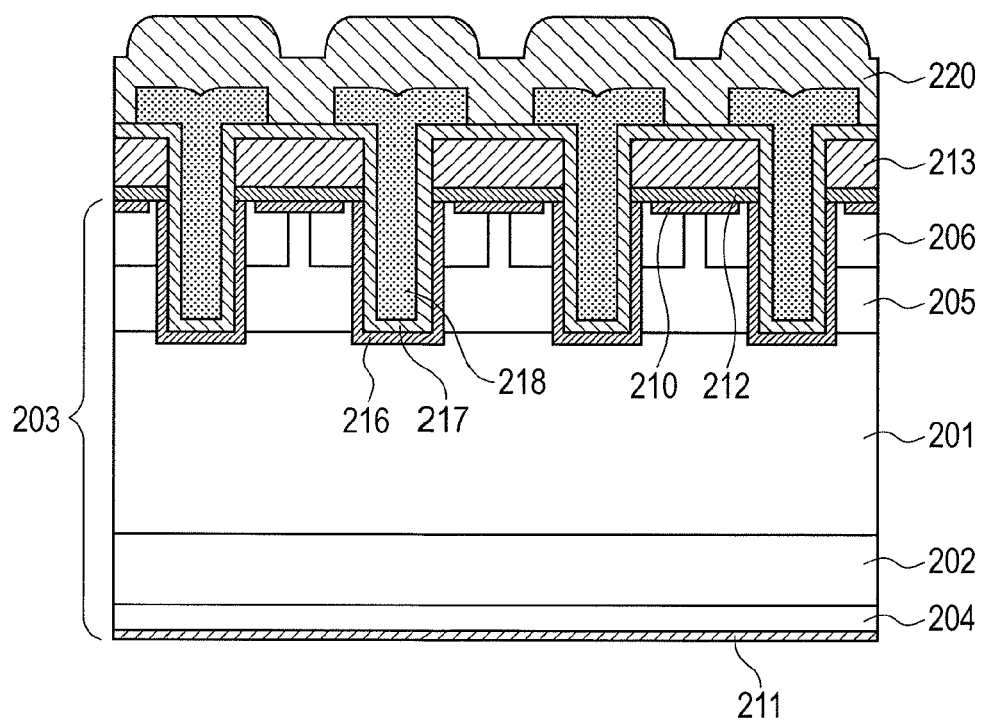
FIG. 2L is a cross sectional view of a step showing the step succeeding to FIG. 2K.

Then, the gate electrode 218 is fabricated. At first, a negative resist is coated, exposed, and developed to obtain a desired resist pattern 219 (FIG. 2K). Successively, the gate electrode 218 is fabricated by dry etching. After fabricating the gate electrode 218, the resist pattern 219 is removed and an interlayer film 220 is deposited (FIG. 2I). As the interlayer film 220, an SiO$_2$ film (silicon oxide film) formed by plasma CVD is used. The thickness is in a range from 300 to 500 nm. After depositing the interlayer film 220, the anti-oxidation film 214 for the metal silicide at the rearface of the SiC epitaxial substrate 203 is removed. The removing method depends on the selected material of the anti-oxidation film 214 for the metal silicide. For example, when the anti-oxidation film 214 for the metal silicide comprises an SiN film, wet etching by hot phosphoric acid is applicable.

Figure 2M:
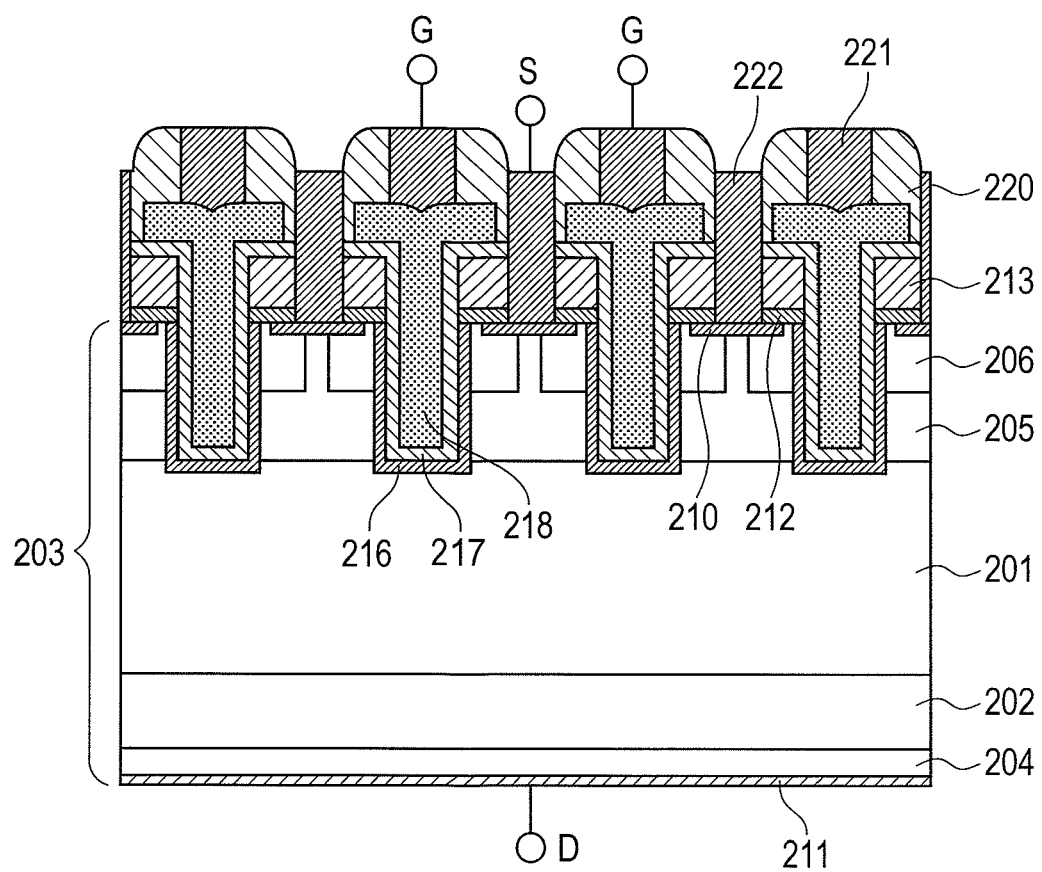
FIG. 2M is a cross sectional view of a step showing the step succeeding to FIG. 2L.

After removing the anti-oxidation film 214 for the metal silicide, a portion of the interlayer film 220, the insulating film 213, and the anti-oxidation film 212 is removed to form an opening for forming a wiring electrode (contact plug) to the gate electrode 218, and the metal silicide film 210 on the surface (FIG. 2M). At first, a positive resist is coated, exposed, and developed to obtain a desired resist pattern (not illustrated). Successively, the interlayer film 220, the insulating film 213, and the anti-oxidation film 212 are apertured by dry etching (FIG. 2M). Successively, a wiring electrode 221 for the gate electrode and a wiring electrode 222 for the source electrode are provided. For the electrodes 221 and 222, titanium, titanium nitride, and aluminum are stacked by a metal CVD apparatus. Further, the thickness is about 10 nm for titanium film, 10 nm for the titanium nitride film and about 250 nm for the aluminum film thickness.

After forming the wiring electrodes 221 and 222, superfluous metal film is removed. The method of removing the superfluous metal film includes, for example, the following method. At first, a negative resist is coated, exposed, and developed to obtain a desired resist pattern (not illustrated). Successively, the wiring electrodes 221 and 222 are fabricated by dry etching. Then, by way of a wiring step, a source wiring and a gate wiring for a unit cell are collected (not illustrated).

As described above, the first subject can be overcome by way of the step of forming the anti-oxidation film 212 of the first embodiment. That is, in a trench MOSFET, a metal silicide layer showing a good ohmic characteristic of $10^{-6}$ Ωcm$^2$ or less can be formed, to suppress increase in the resistance of the source region and obtain a high channel mobility. A SIC semiconductor device capable of attaining low on-resistance can be manufactured by compatible decrease in the contact resistance and decrease in the channel resistance. Further, since this embodiment has no process for removing the metal silicide layer, a mask for removing the metal silicide layer is not necessary and the process can be simplified compared with Japanese Unexamined Patent Application Publication No. 2006-261624.

Further, the SiC semiconductor device according to the first embodiment can overcome the second subject. That is, since the metal silicide layer 110 is directly in contact with the silicon oxide film 113 by way of the anti-oxidation film 112, it is possible to suppress oxidation of the metal silicide layer 110 with oxygen in the silicon oxide film due to the heat generated by current during driving of the device. Accordingly, aging deterioration of the metal silicide layer 110 can be suppressed.

Figure 2N:
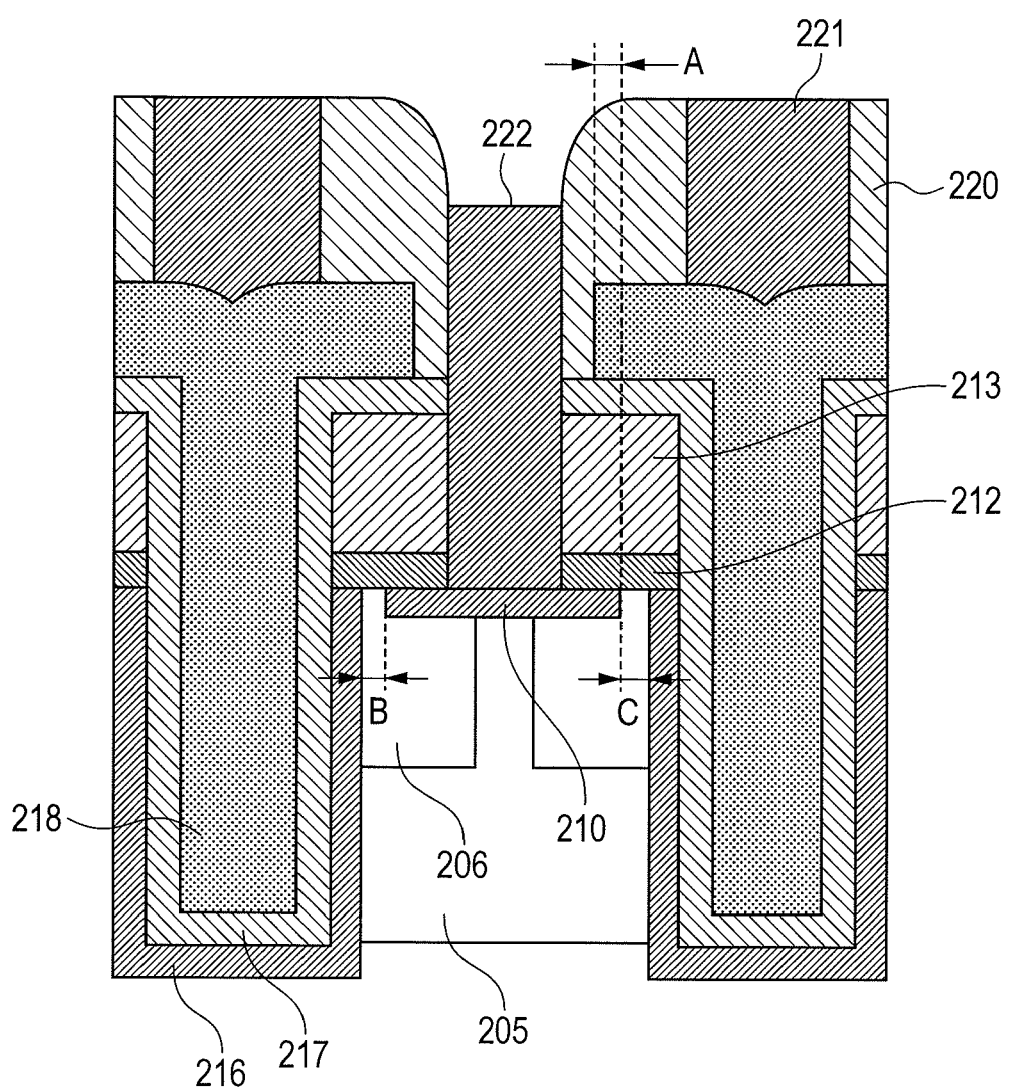
FIG. 2N is an enlarged view for a main portion of FIG. 1.
Figure 2O:
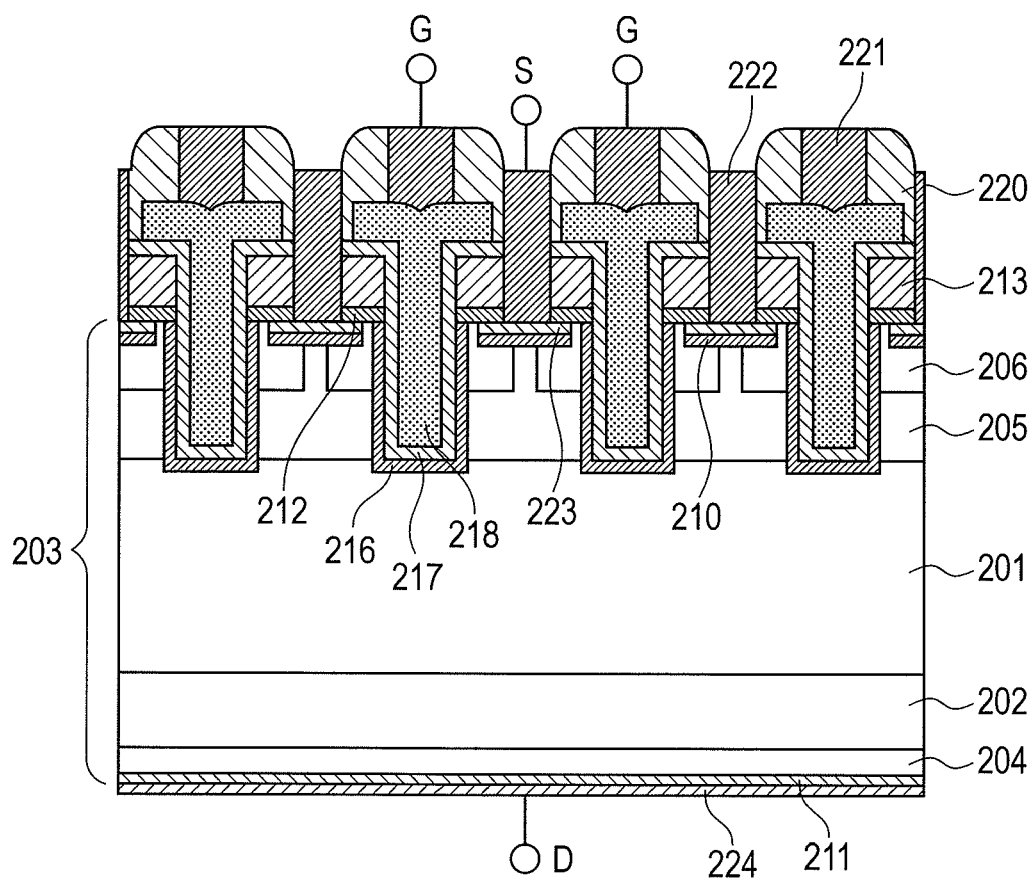
FIG. 2O is a cross sectional view where metal carbide layer is formed over a metal silicide layer in the first embodiment.

Further, the third subject can also be overcome by way of the steps of the first embodiment. In the step of the first embodiment, since the metal silicide layer 110 is formed before forming the gate electrode 118, the end of the metal silicide layer 110 can be disposed near the gate insulating film compared with the end of a wider portion than the trench of the gate electrode. This is to be described with reference to FIG. 2N. FIG. 2N is an enlarged cross sectional view of FIG. 1. As shown in the drawing, the end of the wider portion of the gate electrode 118 and the end of the metal silicide layer 110 overlap for a distance A. That is, it can be configured such that the metal silicide layer 110 can be closer to the gate insulating film by so much as the distance A than the end of the gate electrode. The metal silicide layer 110 can be closer to the channel region without decreasing the cross sectional area of the gate electrode as in Japanese Unexamined Patent Application Publication (Translation of PCT Application) No. 2004-522319 and decrease the resistance of the gate electrode and the source region compatibly. For compatible decrease in the resistance, the effect can be obtained independently even when the anti-oxidation film 112 is not present. When the anti-oxidation film 112 is present, degradation of the metal silicide layer 110 can be suppressed in addition to the effect described above.

Further, in the existent process of leaving the wider portion of the gate electrode in which the metal silicide of the source region is formed subsequently in self-alignment, for ensuring electric insulation between the gate electrode and the source electrode, it was necessary to provide an insulating layer between them on the side wall of the gate electrode. Accordingly, the trench and the end of the metal silicide layer should be spaced apart at least by twice or more of the alignment margin of the exposure apparatus in view of their positional relation for the patterning of leaving the wider portion of the gate electrode and the patterning of the insulating layer thereof. Since trenches are formed on the right and the left of one metal silicide layer, it was necessary to ensure the sum for the distance between the right end of the metal silicide layer and the trench on the right (interface between the gate insulating film and the SiC semiconductor layer) and the distance between the left end of the metal silicide layer and the trench on the left (interface between the gate insulating film and the SiC semiconductor layer) by four times or more of the alignment margin of the exposure apparatus. On the other hand, in this embodiment of the invention, since the metal silicide layer 110 can be formed before forming the gate electrode 118, the distance B between the left end of the metal silicide layer 210 and the lateral surface of the trench on the left (interface between the gate insulating film and the SiC semiconductor layer) the distance C between the right end of the metal silicide layer 210 and the lateral surface of the trench on the right (interface between the gate insulating film and the SiC semiconductor layer) can be less than twice of the alignment margin of the exposure apparatus respectively, and the sum can be twice or more and less than four times. Since the metal silicide 210 is formed before the process for patterning the insulating layer on the side wall of the gate electrode, it is not necessary to ensure the alignment margin of the insulating layer. Accordingly, the metal silicide layer of the source region can be brought closer to the channel region than in the existent device and resistance of the source region can be lowered. In this embodiment, the distance between the end of the metal silicide layer and the interface between the gate insulating film and the SiC semiconductor layer is less than twice of the alignment margin of the exposure apparatus on each side of the metal silicide layer. However, if the metal silicide layer 110 and the gate insulating film interface layer 216 are in contact, since the withstanding voltage of the gate insulating film is deteriorated due to metal contamination, it is desirable that the device is manufactured such that the metal silicide layer and the gate insulating film interface layer 216 are not in contact with each other. The alignment margin of the exposure apparatus is about 100 nm for example, in an exposure apparatus using i-line as a light source, and when the exposure apparatus is used, a device where the distance between the metal silicide layer 110 and the trench (B or C) is about less than 200 nm can be manufactured.

Further, according to this embodiment, for forming the metal silicide layers 210 and 211 on the surface and the rearface of the SiC epitaxial substrate 203, while the metal film and the SiC epitaxial substrate 203 are reacted by the heat of annealing for silicidation, silicidation may be performed also by radiating a laser light. Silicidation for the rearface by the laser light radiation gives no thermal load on the gate insulating interface layer 216 and the gate insulating film 217. Accordingly, it is also possible, for example, to form a metal silicide 211 to the rearface of the SiC epitaxial substrate 203 after forming the gate insulating film 217. In this case, the anti-oxidation film 214 for the metal silicide is not necessary at the rearface of the SiC epitaxial substrate 203.

Further, in this embodiment, the anti-oxidation films 212 and 214 for the metal silicide are formed so as to cover the metal silicide layers 210 and 211 disposed on the surface and the rearface of the SiC epitaxial substrate 203. However, a metal carbide layer 223 may be formed between a metal silicide film 210 and the anti-oxidation film 212 for the metal silicide, and a metal carbide layer 224 may be formed between the metal silicide film 211 and the anti-oxidation film 214 for the metal silicide (FIG. 2O). By the provision of the metal carbide layers 223 and 224, generation of residual carbon upon silicidation is suppressed. According to this manufacturing method, the low contact resistance obtained in this embodiment can be further lowered.

Figure 2P:
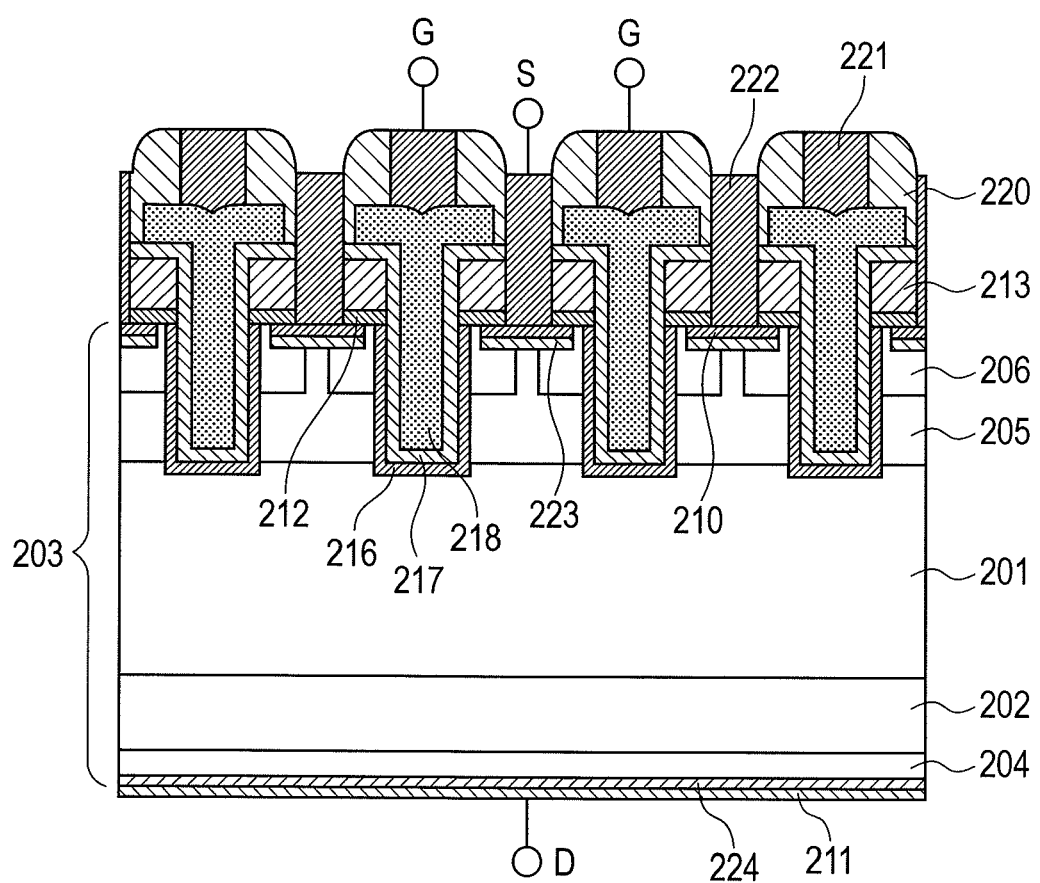
FIG. 2P is a cross sectional view where a metal carbide layer is formed between a SiC epitaxial substrate and the metal silicide layer in the first embodiment.

Further, the metal carbide layer 223 may be formed between the metal silicide 210 and the SiC epitaxial substrate 203, and the metal carbide layer 224 may be formed between the metal silicide 211 and the SiC epitaxial substrate 203 (FIG. 2P). Also in this manufacturing method, the low contact resistance obtained in this embodiment can be further lowered. As the metal material forming the metal carbide layers 223 and 224, a carbide film containing at least one element selected from titanium, tantalum, and aluminum is used.

Figure 2Q:
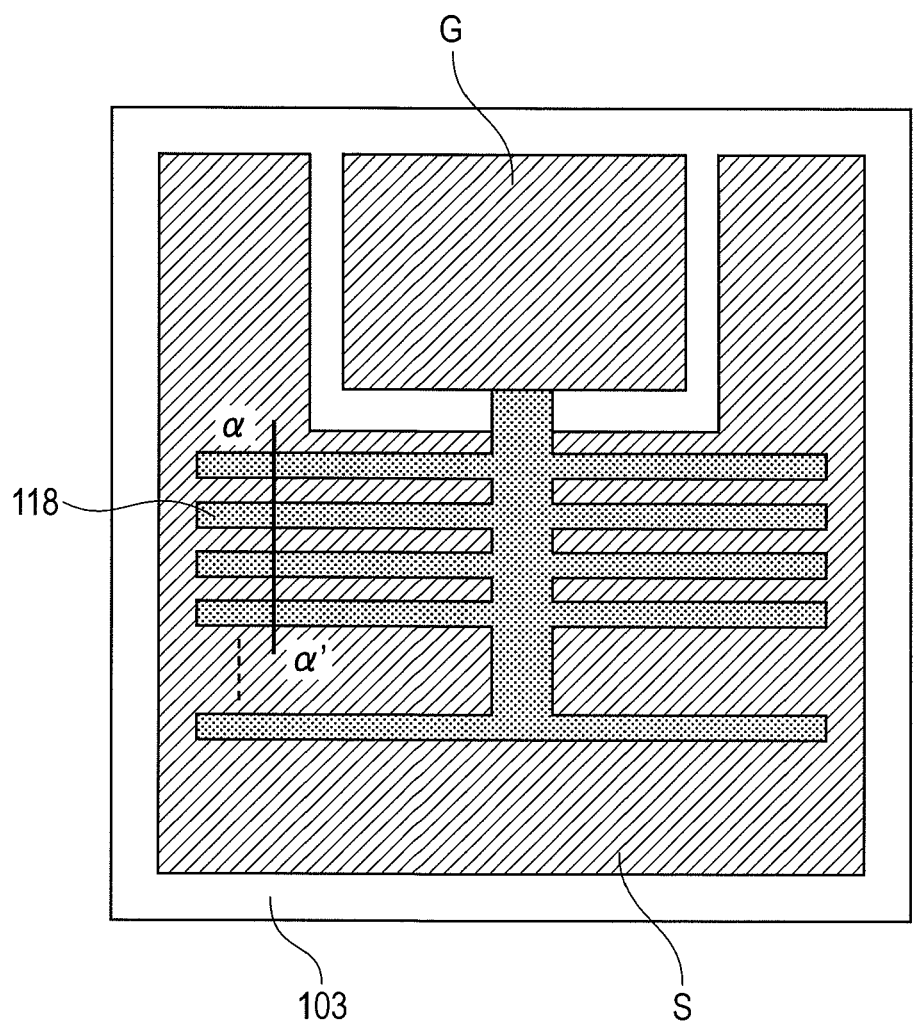
FIG. 2Q is a layout chart for the upper plane of FIG. 1.

Finally, the layout for the upper surface of the device in FIG. 1 is to be described with reference to FIG. 2Q. G and S in the upper surface are a gate electrode pad and a source electrode pad respectively. While, a structure such as gate electrode pad is formed actually also over the gate electrode 118 and the gate 118 cannot be seen in the layout for the upper surface, such a structure is not shown in the layout for the sake of explanation. As shown in the drawing, respective gate electrodes 118 are collected at a central portion and electrically connected to the gate electrode pad. The cross sectional view of FIG. 1 corresponds to the cross section along α-α' in FIG. 2Q. FIG. 1 shows a wiring electrode (contact plug) 121 to the gate electrode and the wiring electrode (contact plug) 122 to the source region. However, for the wiring electrode 121 to the gate electrode, such plugs are not present at all of the cross sections in the direction where the gate electrode 118 is extended (lateral direction) but present only to some regions. That is, some cross sections along the segment α-α' displaced in parallel contain no wiring electrode 121. Therefore, it is necessary to decrease the resistance of the gate electrode per se for each of the gate electrodes 118 for suppressing the current loss in the path relative to the gate electrode pad G. Since the first embodiment has a structure where the gate electrode is extended in a direction vertical to the cross sectional direction of FIG. 1, the resistance of the gate electrode per se is decreased by making the portion of gate electrode 118 wider at the outside of the trench as shown in FIG. 1.

Second Embodiment

A second embodiment of the invention is to be described in details with reference to the drawings. The second embodiment is an example applied to a DMOSFET. This is relatively inferior to the trench type in view of the mobility and the degree of integration, the first and the second subjects can be overcome also in the DMOSFET by the anti-oxidation film.

Figure 3A:
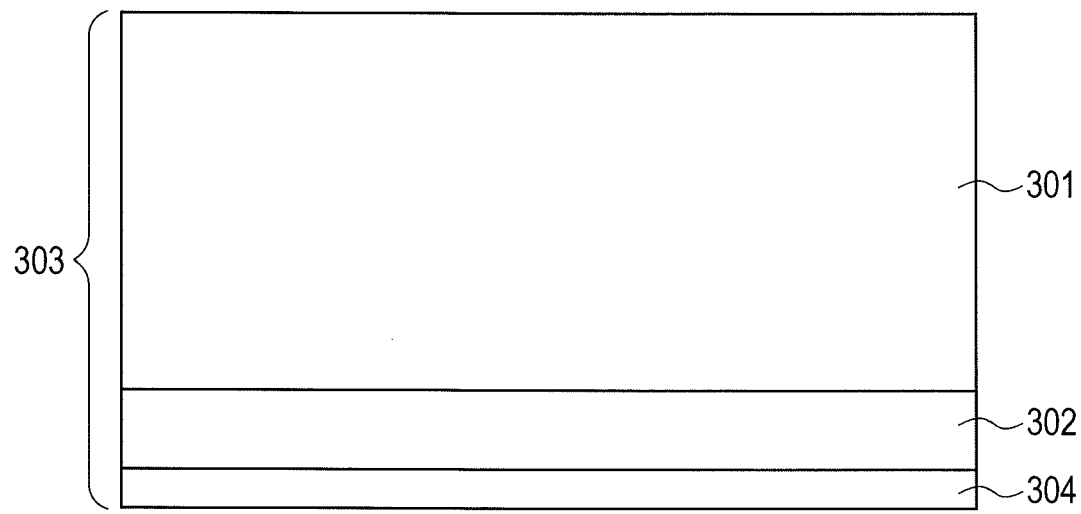
FIG. 3A is a cross sectional view of a step for explaining a method of manufacturing an SiC semiconductor device.
Figure 3B:
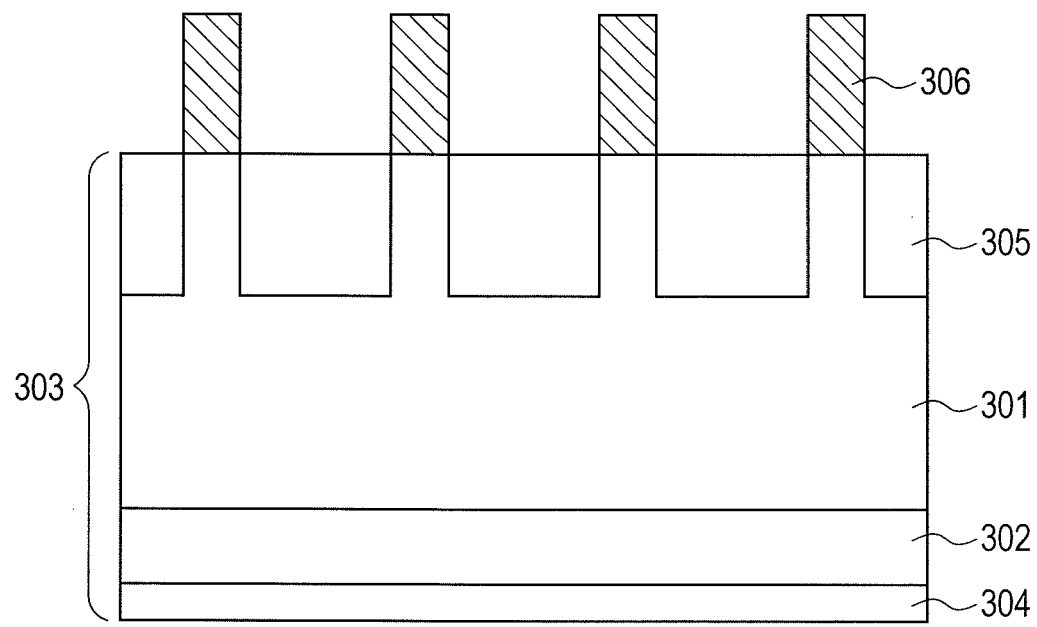
FIG. 3B is a cross sectional view of a step showing the step succeeding to FIG. 3A.
Figure 3C:
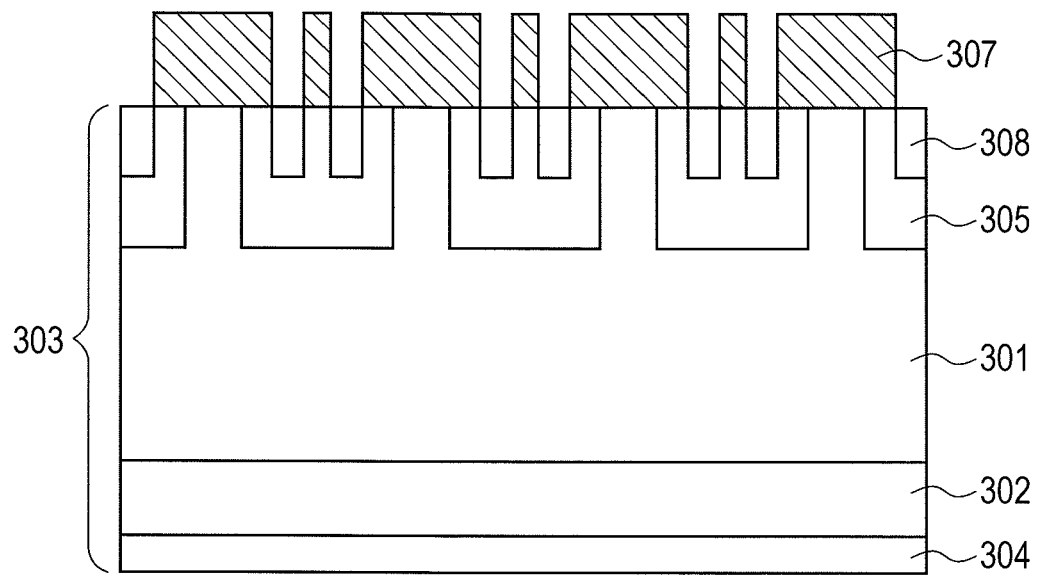
FIG. 3C is a cross sectional view of a step showing the step succeeding to FIG. 3B.

A method of manufacturing a SiC semiconductor device in the second embodiment of the invention is to be described with reference to FIG. 3A to FIG. 3M. The SiC semiconductor device has a structure in which multiple unit cells of DMOSFETs are arranged. FIG. 3 shows a portion of the multiple unit cells. At first, the same steps as in FIG. 2A to FIG. 2G described in the first embodiment are passed. At first, a N$^-$-type epitaxial layer 301 is epitaxially grown over a SiC substrate 302 to obtain a SiC epitaxial substrate 303. Successively, a N$^+$ type diffusion layer region 304 as a drain is formed to the rearface (FIG. 3A). Then, a resist 306 is patterned and a P type body layer 305 is formed by ion implantation (FIG. 3B). After removing the resist 306 to form the body layer 305, a resist 307 is patterned again and a N$^+$ type diffusion layer region 308 is formed as a source (FIG. 3C). After removing the resist 307, a heat treatment for activation is performed at 1500° C. or higher.

Figure 3D:
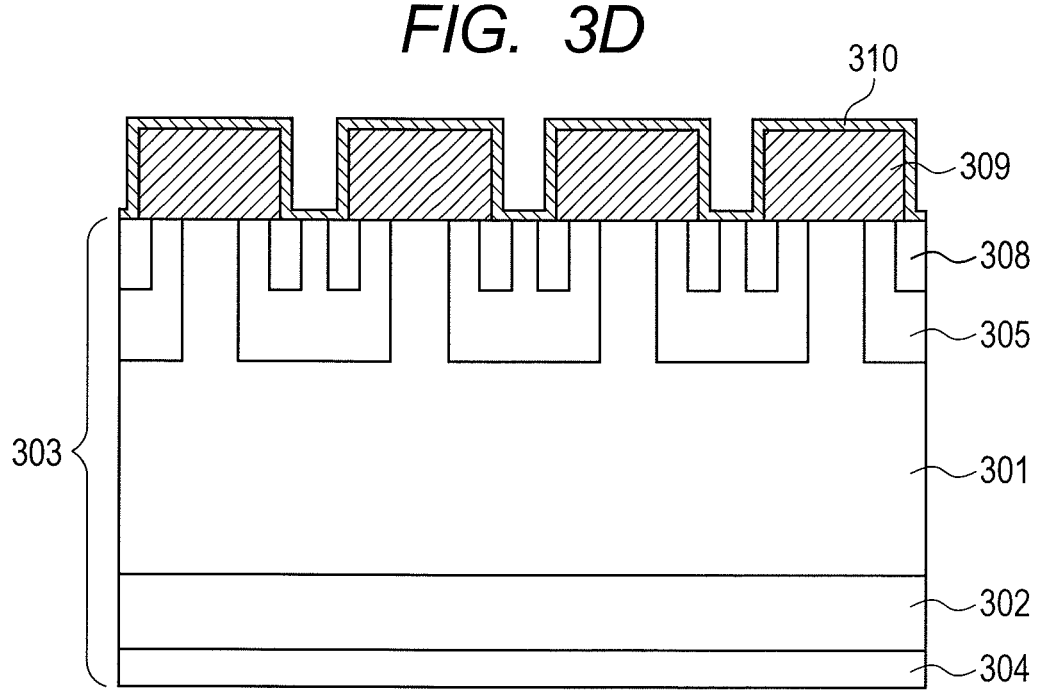
FIG. 3D is a cross sectional view of a step showing the step succeeding to FIG. 3C.
Figure 3E:
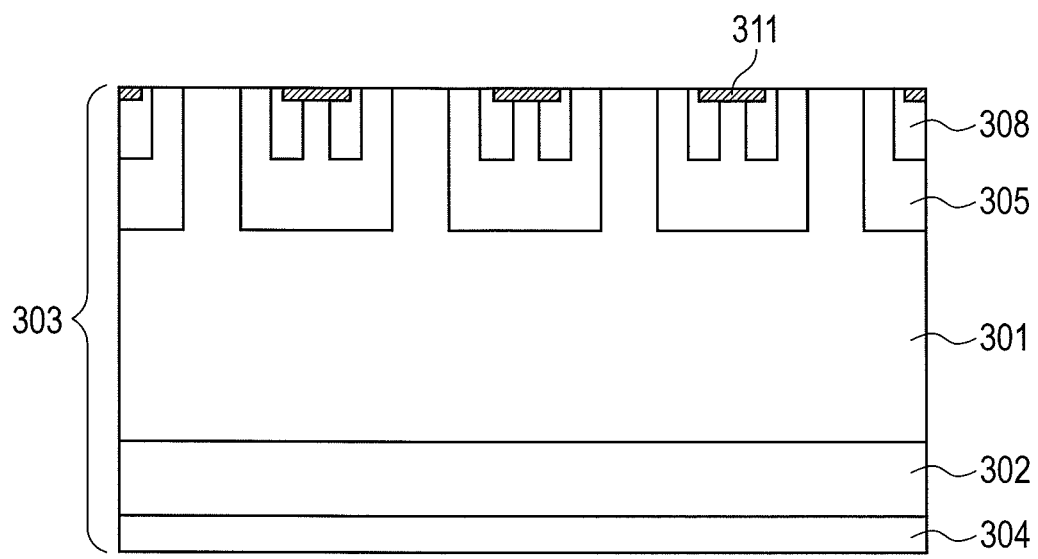
FIG. 3E is a cross sectional view of a step showing the step succeeding to FIG. 3D.

Then, a silicon oxide film is deposited over the entire surface of the SiC epitaxial substrate and fabricated into a predetermined pattern 309. A metal film 310 is formed to the surface of the silicon oxide film 309 (FIG. 3D). Successively, a heat treatment is performed and unnecessary metal film is removed in the same manner as in the first embodiment to form a metal silicide 311 on the surface of the heat treated SiC epitaxial substrate 303 (FIG. 3E). Thus, multiple metal silicide layers separated from each other are formed on the SiC semiconductor layer.

Figure 3F:
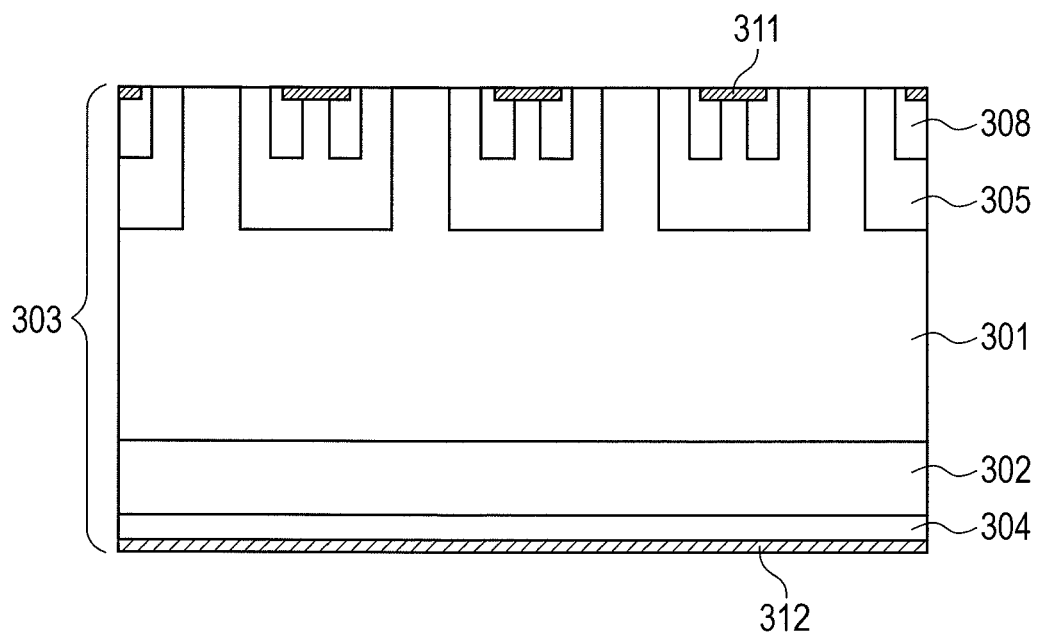
FIG. 3F is a cross sectional view of a step showing the step succeeding to FIG. 3F.

Successively, a metal silicide 312 is formed on the rearface in the same manner as in the first embodiment (FIG. 3F). Further, an anti-oxidation film 313 for the metal silicide and an insulating film 314 comprising a SiO$_2$ film are formed on the surface of the SiC epitaxial substrate 303 (FIG. 3G).

Figure 3G:
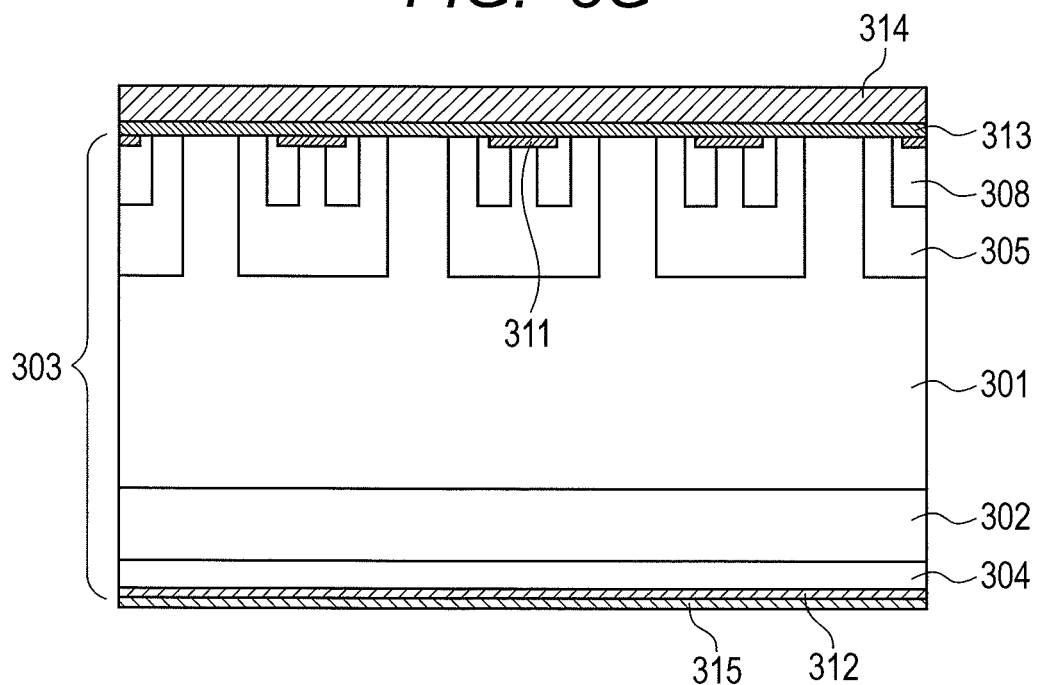
FIG. 3G is a cross sectional view of a step showing the step succeeding to FIG. 3E.

Further, an anti-oxidation film 315 for the metal silicide is formed also on the rearface of the SiC epitaxial substrate 303 (FIG. 3G).

Figure 3H:
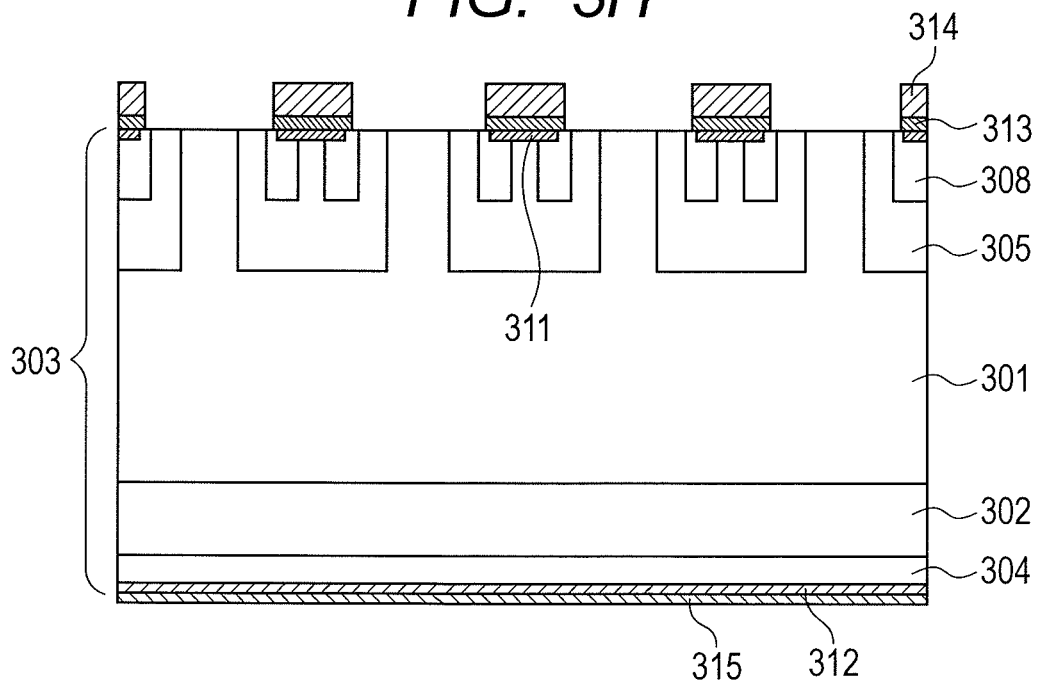
FIG. 3H is a cross sectional view of a step showing the step succeeding to FIG. 3G.

Then, the insulating film 314 and the anti-oxidation film 313 for the metal silicide are apertured by wet etching (FIG. 3H). The insulating film 314 is wet etched by using BHF (buffered hydrofluoric acid). After aperturing the insulating film 314, the anti-oxidation film 313 for the metal silicide is apertured. The removing method depends on the material of the anti-oxidation film 313 for the metal silicide. For example, when the material of the anti-oxidation film 313 for the metal silicide comprises a SiN film, wet etching using hot phosphoric acid is applicable. The SiC epitaxial substrate 303 is scraped by the wet etching and the scraped thickness is 50 nm or less.

Figure 3I:
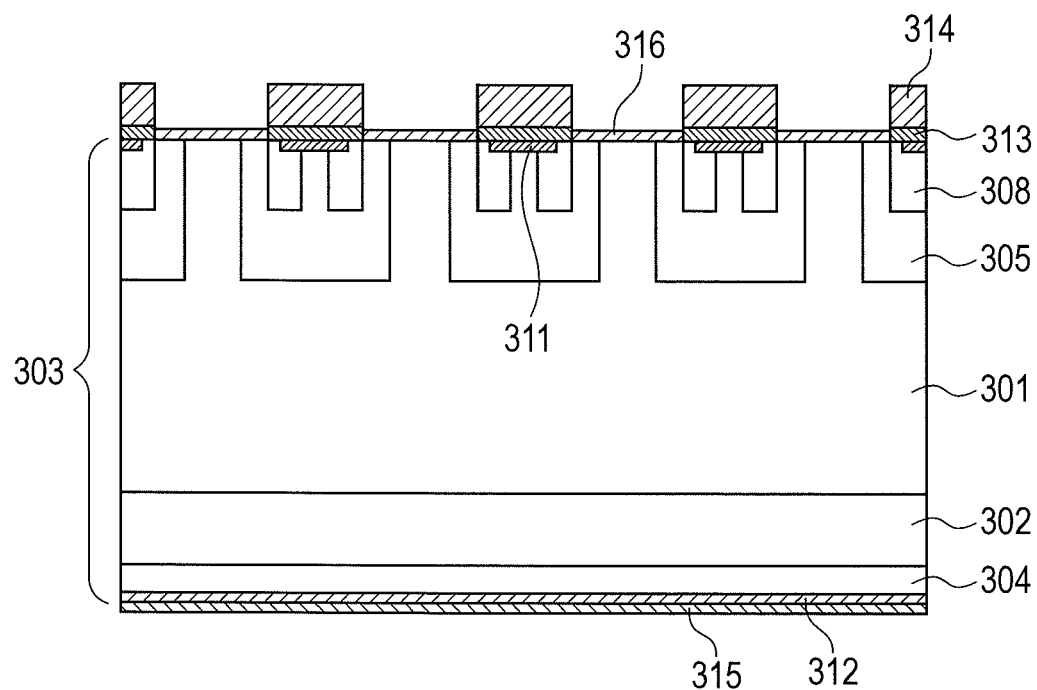
FIG. 3I is a cross sectional view of a step showing the step succeeding to FIG. 3H.
Figure 3J:
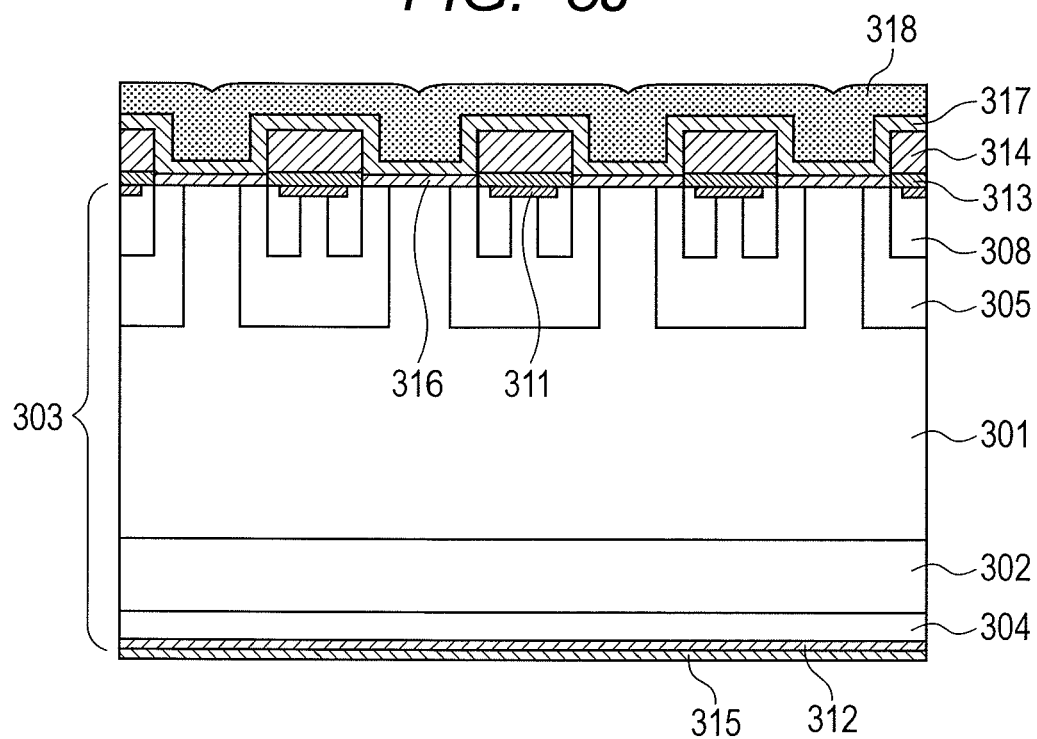
FIG. 3J is a cross sectional view of a step showing the step succeeding to FIG. 3I.
Figure 3K:
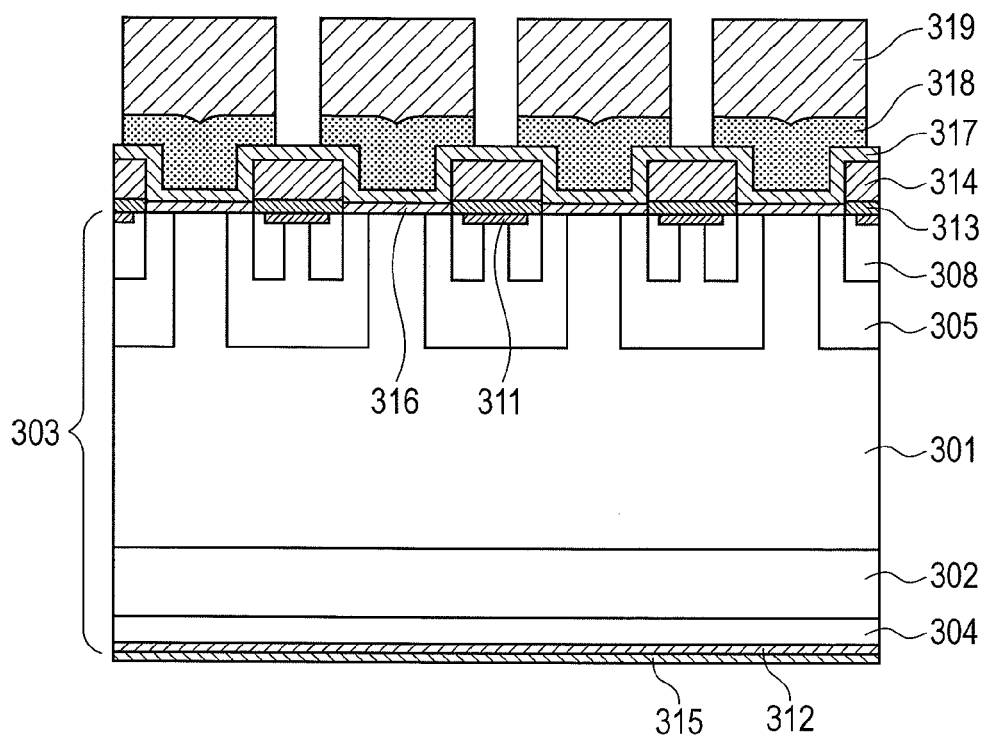
FIG. 3K is a cross sectional view of a step showing the step succeeding to FIG. 3J.

Successively, the same steps as described in FIG. 2I to FIG. 2M described for the first embodiment are passed. At first, after pre-cleaning with HF diluted to a 1/100 concentration, a gate insulating film interface layer (gate oxide film) 316 is formed (FIG. 3I). Then, a gate insulating film 317 and a gate electrode 318 are formed (FIG. 3J). After forming the gate electrode 318, the gate electrode 318 is fabricated into a desired pattern by using a resist pattern 319 (FIG. 3K).

Figure 3L:
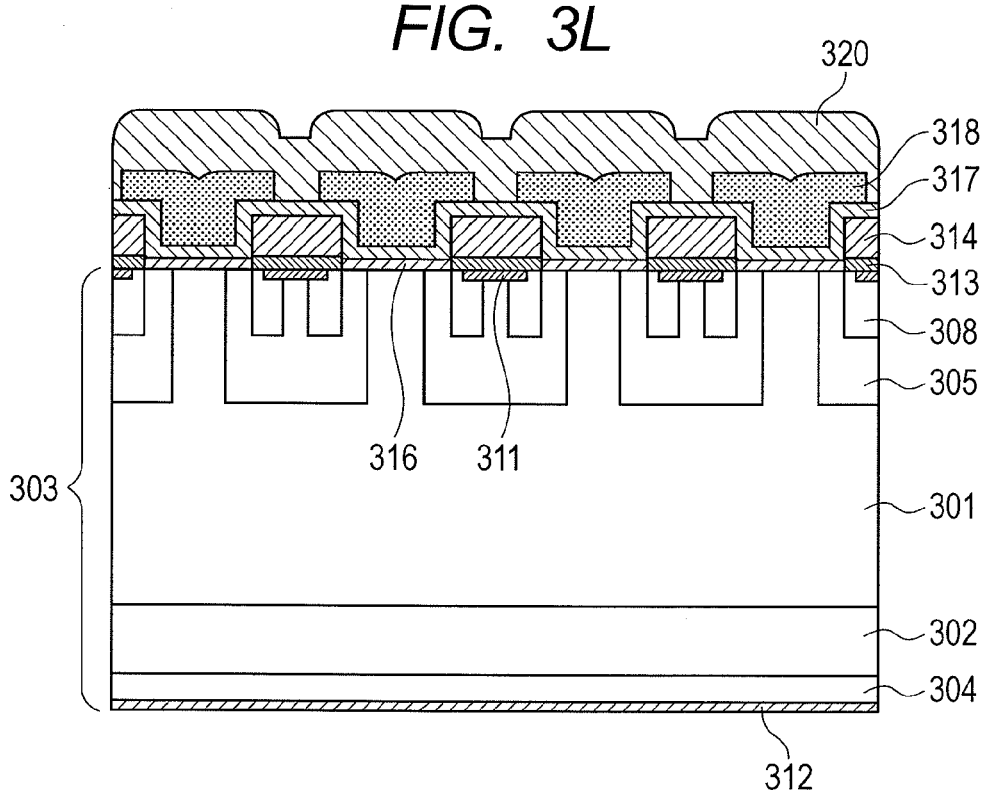
FIG. 3L is a cross sectional view of a step showing the step succeeding to FIG. 3K.
Figure 3M:
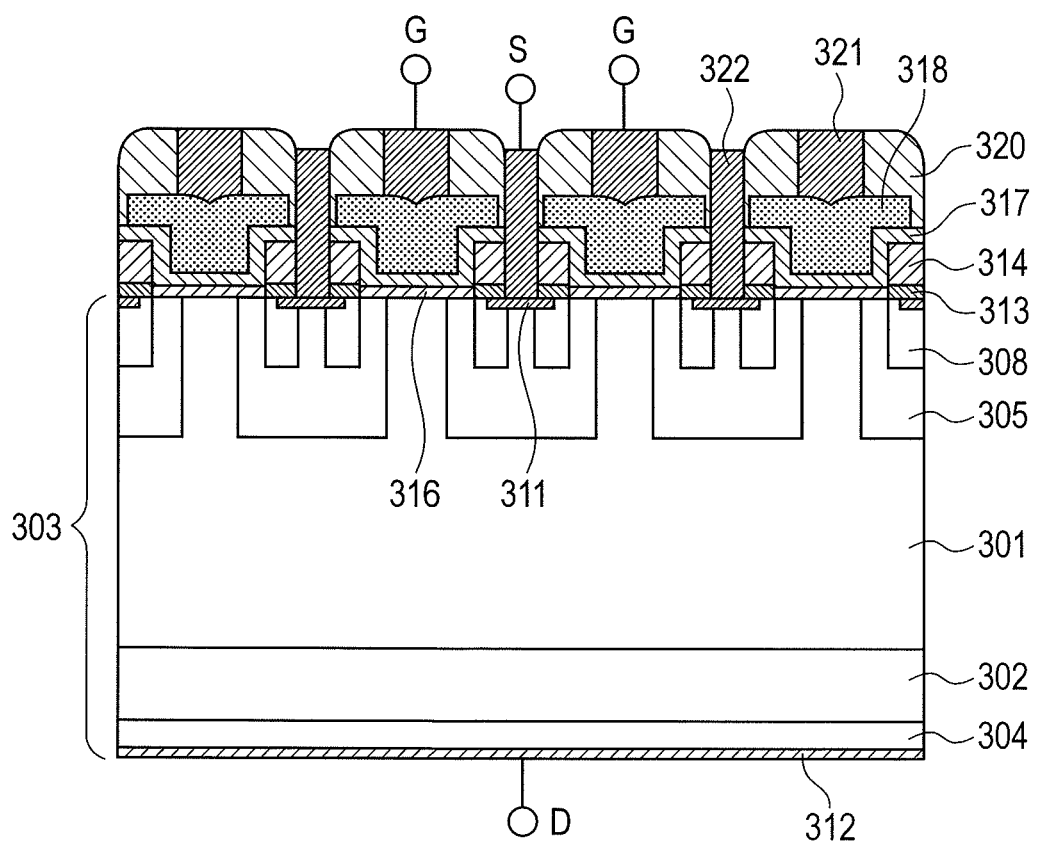
FIG. 3M is a cross sectional view of a step showing the step succeeding to FIG. 3L.

After fabricating the gate electrode 318, an interlayer film 320 is formed (FIG. 3L). After forming the interlayer film 320, the anti-oxidation film 315 for the metal silicide is removed. After removing the anti-oxidation film 315 for the metal silicide, the interlayer film 320, the insulating film 314, and the anti-oxidation film 313 for the metal silicide are apertured for forming the wiring electrode (contact plug) to the gate electrode 318 and the metal silicide film 311 on the surface (FIG. 3M). Successively, a wiring electrode 321 to the gate and a wiring electrode 322 to the source are formed. The wiring electrodes 321 and 322 are fabricated each into a desired shape and, after the wiring step, the gate wiring and the source wiring of the unit cell are collected, for example, as shown in FIG. 2Q.

By way of the steps of the second embodiment described above, a metal silicide showing good ohmic characteristic of $10^{-6}$ $\Omega cm^2$ or less is formed, and high channel mobility can be obtained in the DMOSFET. Due to compatible low contact resistance and low channel resistance, a SiC semiconductor device attaining low on-resistance can be manufactured. For other effects, since identical effects with those in the first embodiment are obtained except for compatible decrease in the resistance of the gate electrode and the source electrode which are the effect inherent to trench type, they are not described herein. Further, the step and the structure of providing the metal carbide layer as in FIG. 2O and FIG. 2P can also be adopted and the same effect as that in the first embodiment can be obtained.

Third Embodiment

A third embodiment of the invention is to be described in details with reference to the drawings. While the third embodiment is a trench MOSFET as in the first embodiment, this embodiment is different in that the trench is formed before forming the metal silicide layer. Since the trench is formed before forming the metal silicide layer, a high temperature heat treatment can be applied to the bottom and the side of the trench without giving thermal load on the metal silicide layer and the surface roughness caused by the trench etching can be recovered.

Figure 4A:
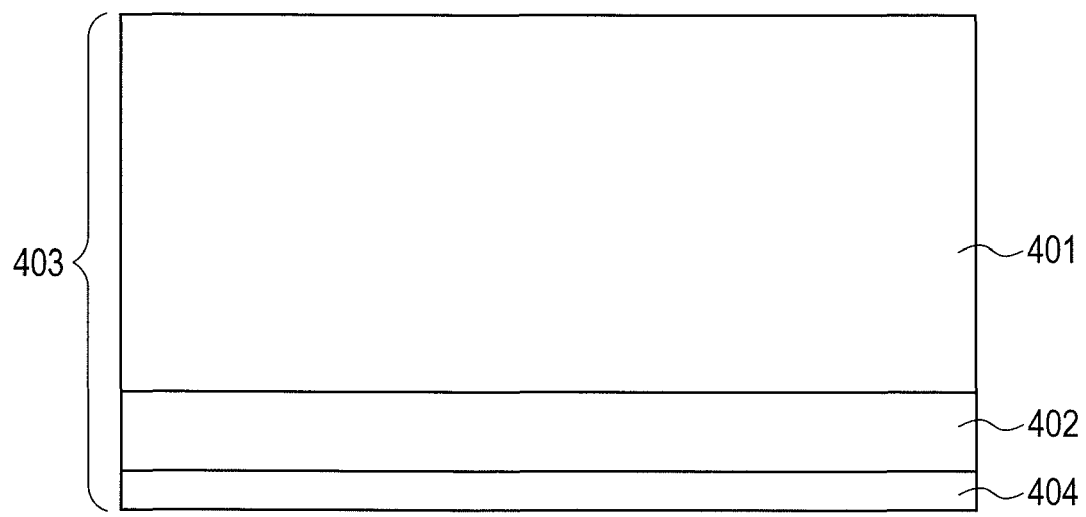
FIG. 4A is a cross sectional view of a step for explaining a method of manufacturing a SiC semiconductor device.
Figure 4B:
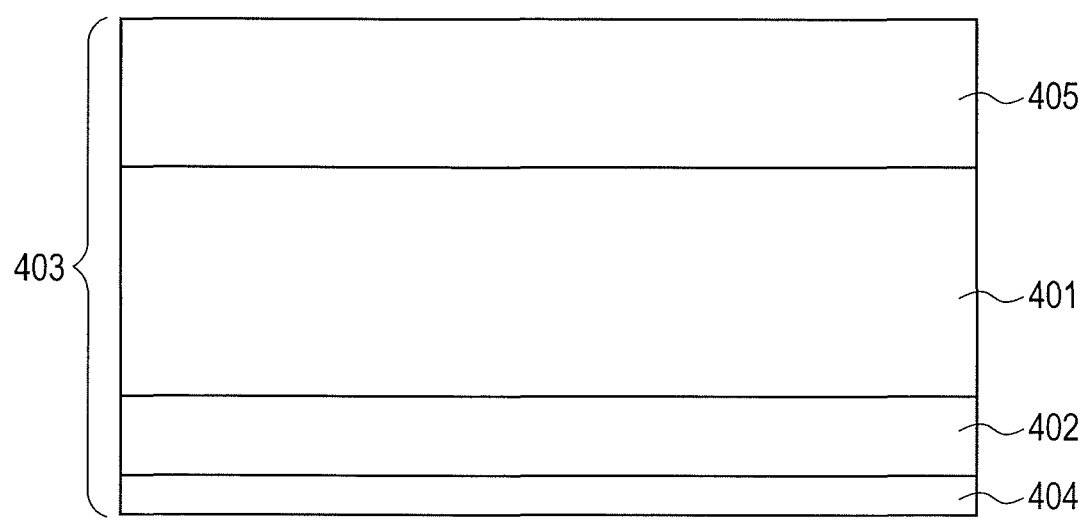
FIG. 4B is a cross sectional view of a step showing the step succeeding to FIG. 4A.
Figure 4C:
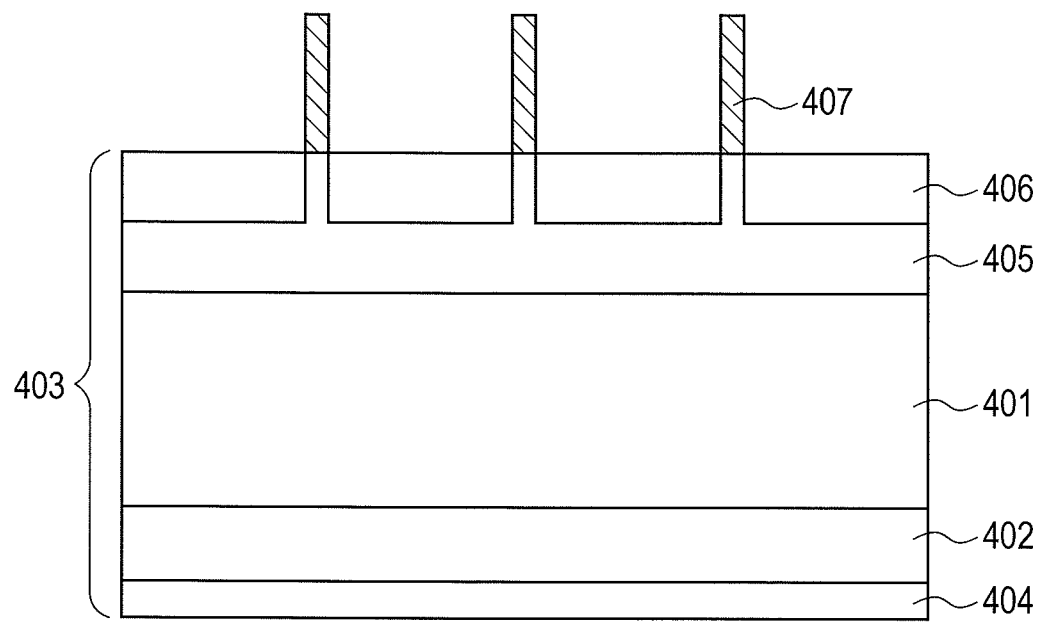
FIG. 4C is a cross sectional view of a step showing the step succeeding to FIG. 4B.

A method of manufacturing a SiC semiconductor device in the third embodiment of the invention is to be described with reference FIG. 4A to FIG. 4O. At first, the steps identical with those in FIG. 2A to FIG. 2C described in the first embodiment are passed. At first, a $N^-$-type epitaxial layer 401 is epitaxially grown over a SiC substrate 402 to obtain an SiC epitaxial substrate 403. Successively, a $N^+$-type diffusion layer region 404 as a drain is formed to the rearface (FIG. 4A). Then, a P type body layer 405 is formed (FIG. 4B). After forming the body layer 405, a $N^+$-diffusion layer region 406 as a source is formed (FIG. 4C). Successively, after covering the both faces of the SiC epitaxial layer 403 with carbon films, a heat treatment for activation is performed at 1500° C. or higher (not illustrated). After removing the covered carbon film, the deteriorated surface of the SiC epitaxial substrate 403 is removed by sacrificial oxidation (not illustrated).

Figure 4D:
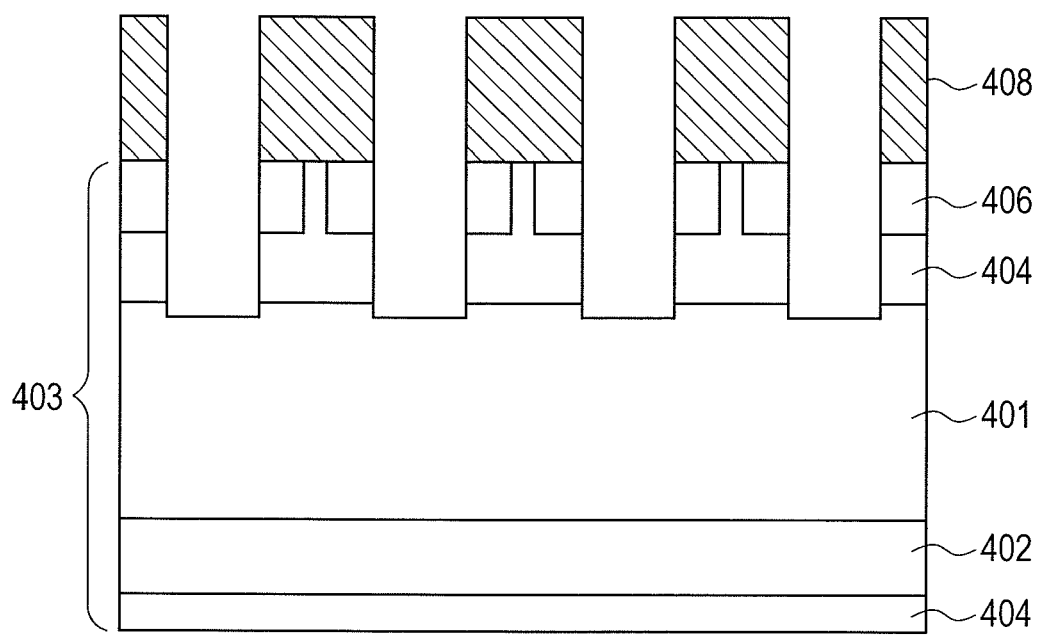
FIG. 4D is a cross sectional view of a step showing the step succeeding to FIG. 4C.

Then, trenches are formed in the SiC epitaxial substrate 403 (FIG. 4D). At first a positive resist is coated, exposed, and developed to obtain a desired resist pattern 408 (FIG. 4D) Successively, the SiC epitaxial substrate 403 is engraved by dry etching till the body layer 405 is penetrated. The depth of the trench is preferably in a range from 1 to 2 μm (FIG. 4D).

Figure 4E:
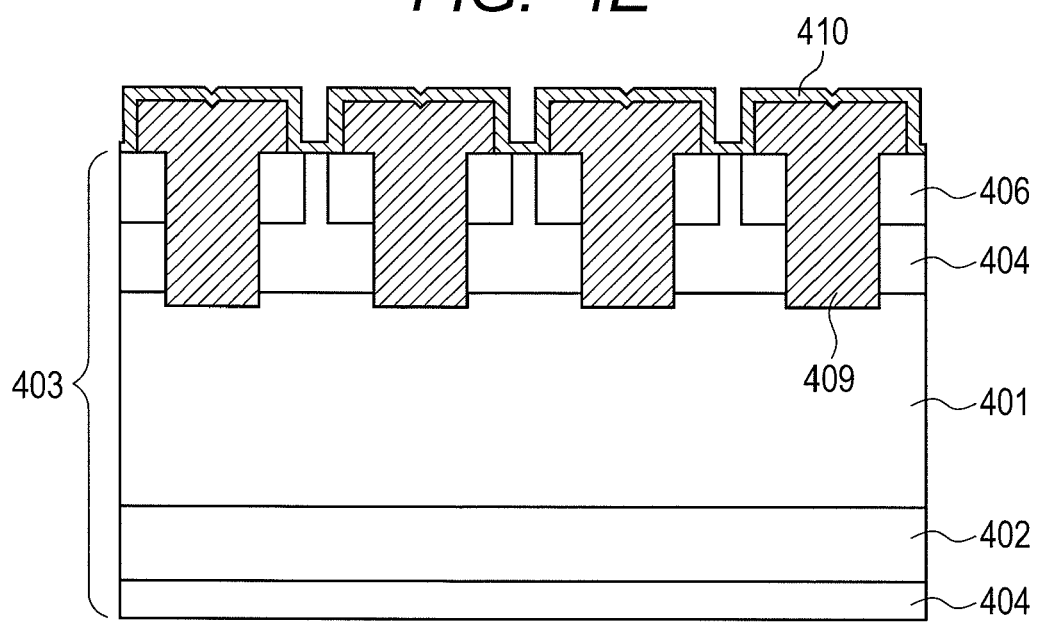
FIG. 4E is a cross sectional view of a step showing the step succeeding to FIG. 4D.

After forming the trenches in the SiC epitaxial substrate 403, the resist pattern 408 is removed and a recovering heat treatment is performed in an atmosphere comprising silane and argon, or in a hydrogen atmosphere for recovering the smoothness lost by dry etching (not illustrated). The heat treatment temperature is preferably 1000° C. or higher. Since the treatment is performed before forming the metal silicide layer, the heat treatment can be applied at a high temperature. After recovering the smoothness of the trench, a metal silicide layer 411 is formed to a portion of the $N^+$ type diffusion region 406 and the body layer 404. At first, an $SiO_2$ film 409 is deposited on the surface of the SiC epitaxial substrate 403 by a plasma CVD apparatus (FIG. 4E). The thickness of the $SiO_2$ film 409 is about 1 μm. Successively, a portion for forming the metal silicide layer 411 is apertured. At first, a positive resist is coated, exposed, and developed to obtain a desired resist pattern (not illustrated). Then, the $SiO_2$ film 409 is fabricated by dry etching (FIG. 4E). After pre-cleaning with HF diluted to a 1/100 concentration for 30 sec, a metal film 410 is deposited to about 20 nm on the surface of the SiC epitaxial substrate 403 by using a magnetron sputtering apparatus (FIG. 4E).

Figure 4F:
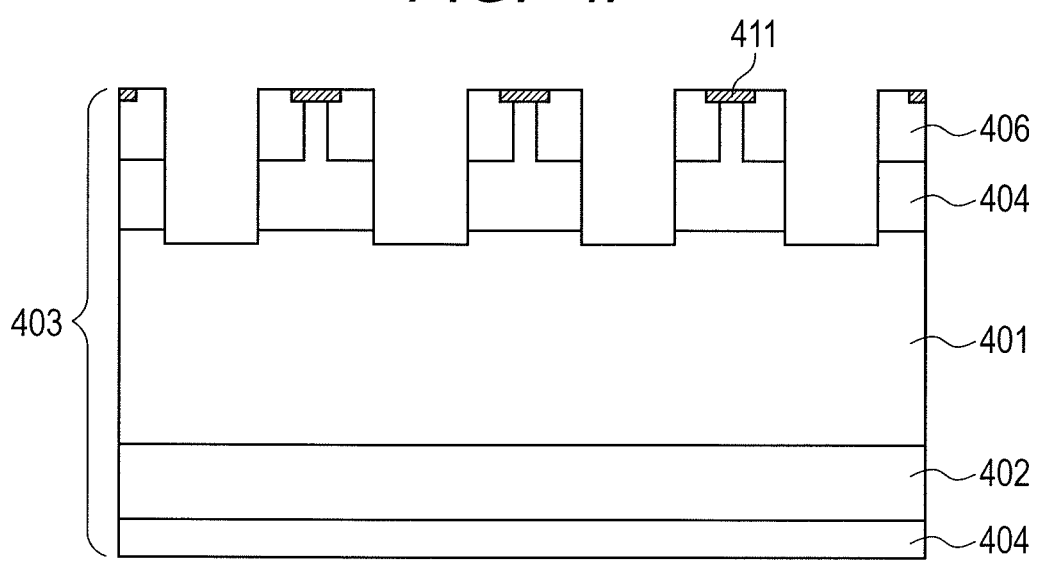
FIG. 4F is a cross sectional view of a step showing the step succeeding to FIG. 4E.

Then, annealing for silicidation is performed at 800° C. to react the metal film 410 and the SiC epitaxial substrate 403 to form a metal silicide layer 411 (FIG. 4F). In this step, the metal silicide layer 411 shows a Schottky characteristic.

After forming metal silicide layer 411, unreacted metal film is removed by using wet etching, and the $SiO_2$ film 409 is removed with HF diluted to a 1/10 concentration. In the wet etching for removing the metal film, a sulfuric acid/hydrogen peroxide mixture is used for example. By way of the step described above, the metal silicide layer 411 is fabricated into a desired shape (FIG. 4F).

Figure 4G:
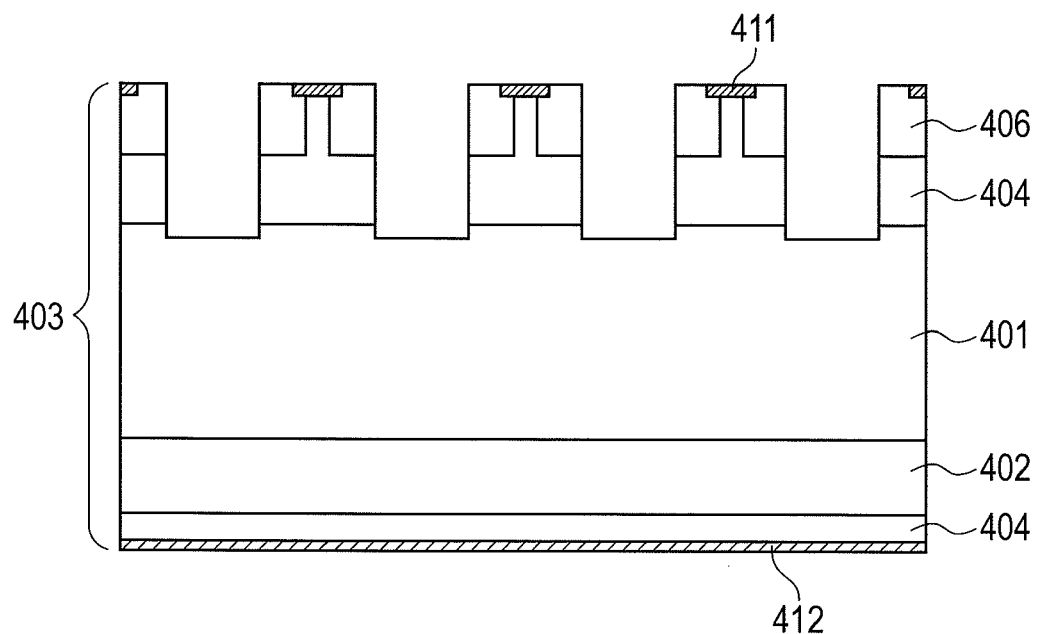
FIG. 4G is a cross sectional view of a step showing the step succeeding to FIG. 4F.

Then, a metal silicide layer 412 is formed so as to cover the rearface of the $N^+$ type diffusion layer region 404 (FIG. 4G). At first, after the pre-cleaning with HF diluted to a 1/100 concentration for 30 sec, a metal film (not illustrated) is deposited to about 100 nm to the rearface of the SiC epitaxial substrate 403 by using a magnetron sputtering apparatus. Then, annealing for silicidation is performed at 1000° C. and the metal film and the SiC epitaxial substrate 403 are reacted to form a metal silicide layer 412. At this step, the metal silicide layer 411 on the surface and the metal silicide layer 412 on the rearface show a good ohmic characteristic of $10^{-6}$ $\Omega cm^2$ or less. After forming the metal silicide layer 412, an unreacted metal film is removed by using wet etching (FIG. 4G).

Figure 4H:
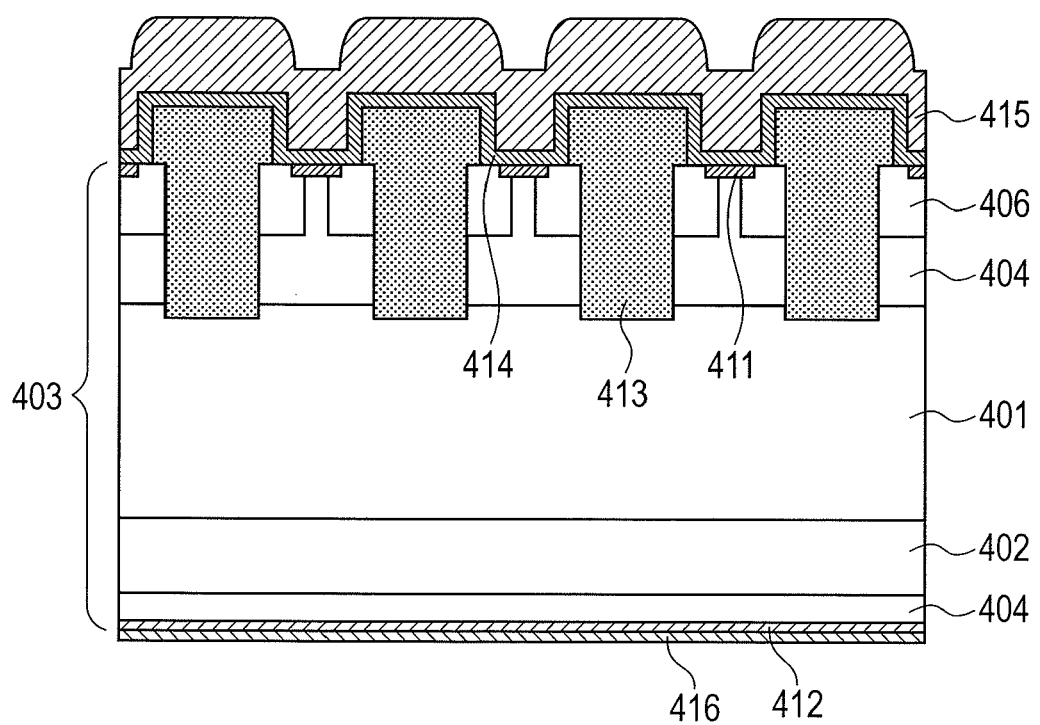
FIG. 4H is a cross sectional view of a step showing the step succeeding to FIG. 4G.

After forming the metal silicide layers 411 and 412 at the surface and the rearface of the SiC epitaxial substrate 403, the trenches engraved in the SiC epitaxial substrate 403 are buried with dummy gates 413 (FIG. 4H). For the dummy gate 413, a thermally and physically stable material is preferred and, for example, a polyimide or a resist is selected. The dummy gate 413 is coated, exposed, and developed to obtain a desired pattern of the dummy gates 413. The height for the convex portion of the dummy gate 413 is about 300 nm from the surface of the SiC epitaxial substrate 403. After forming the dummy gates 413, an SiN (silicon nitride) film is formed as an anti-oxidation film 414 for the metal silicide to the surface by about 50 nm by a plasma CVD apparatus (FIG. 4H). Successively, a SiO$_2$ film is formed on the surface as an insulating film 415 by a plasma CVD apparatus. The thickness of the SiO$_2$ film is about 1 μM (FIG. 4H). Then, SiN is formed as the anti-oxidation film 416 for the metal silicide to about 50 nm to the rearface of the SiC epitaxial substrate 403 in the same manner as that to the surface by a plasma CVD apparatus (FIG. 4H).

Figure 4I:
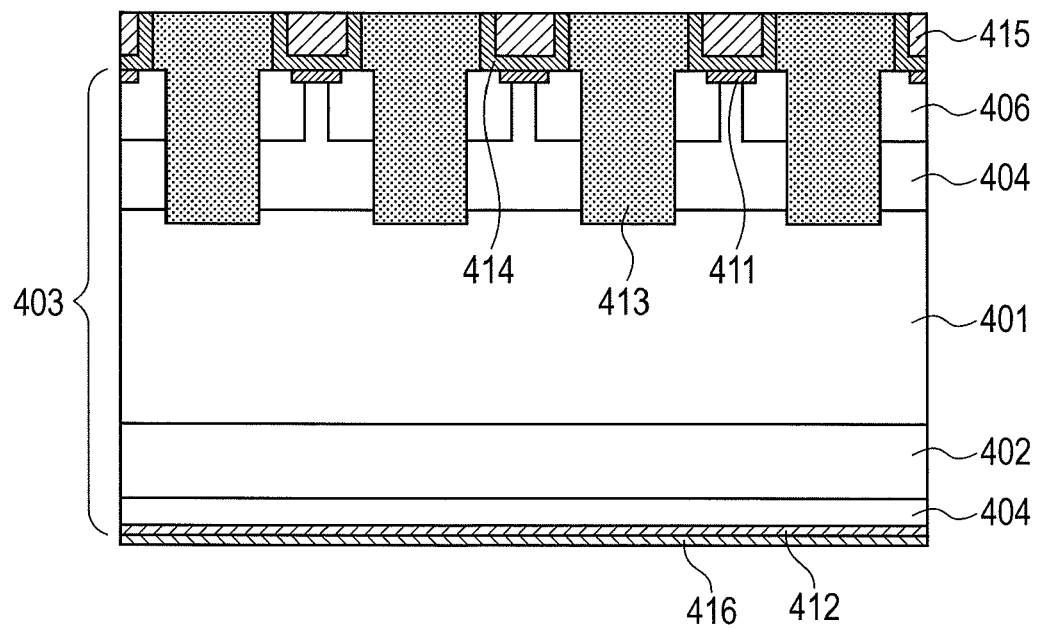
FIG. 4I is a cross sectional view of a step showing the step succeeding to FIG. 4H.

After forming the anti-oxidation film 416 for the metal silicide, the surface of the insulating film 415 and the anti-oxidation film 414 for the metal silicide are polished till the upper portion of the dummy gates 413 is exposed by CMP (Chemical Mechanical Polishing) (FIG. 4I).

Figure 4J:
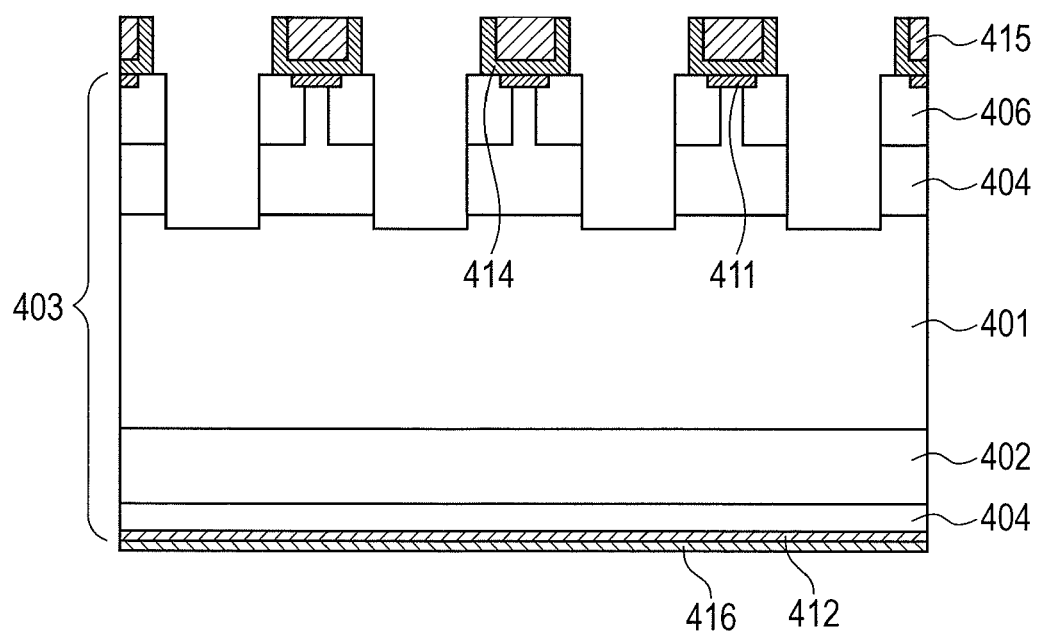
FIG. 4J is a cross sectional view of a step showing the step succeeding to FIG. 4I.

After the CMP, the dummy gates 413 are removed. The removing agent depends on the material of the dummy gate 413 and a liquid mixture of ethylenediamine and hydrazine may be used, for example, in a case of using a polyimide (FIG. 4J).

Figure 4K:
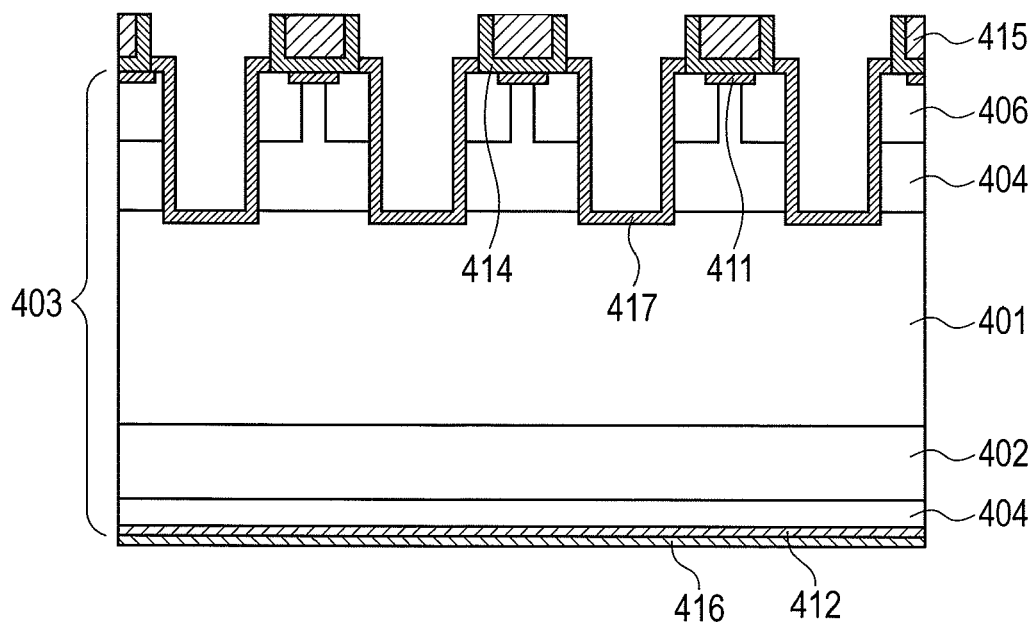
FIG. 4K is a cross sectional view of a step showing the step succeeding to FIG. 4J.
Figure 4L:
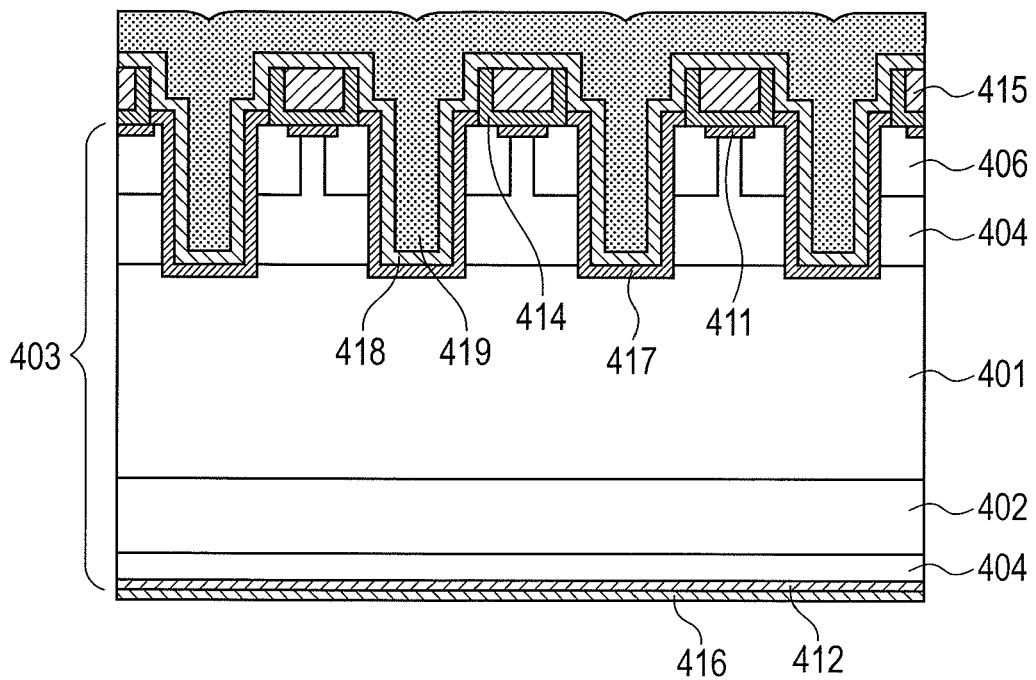
FIG. 4L is a cross sectional view of a step showing the step succeeding to FIG. 4K.
Figure 4M:
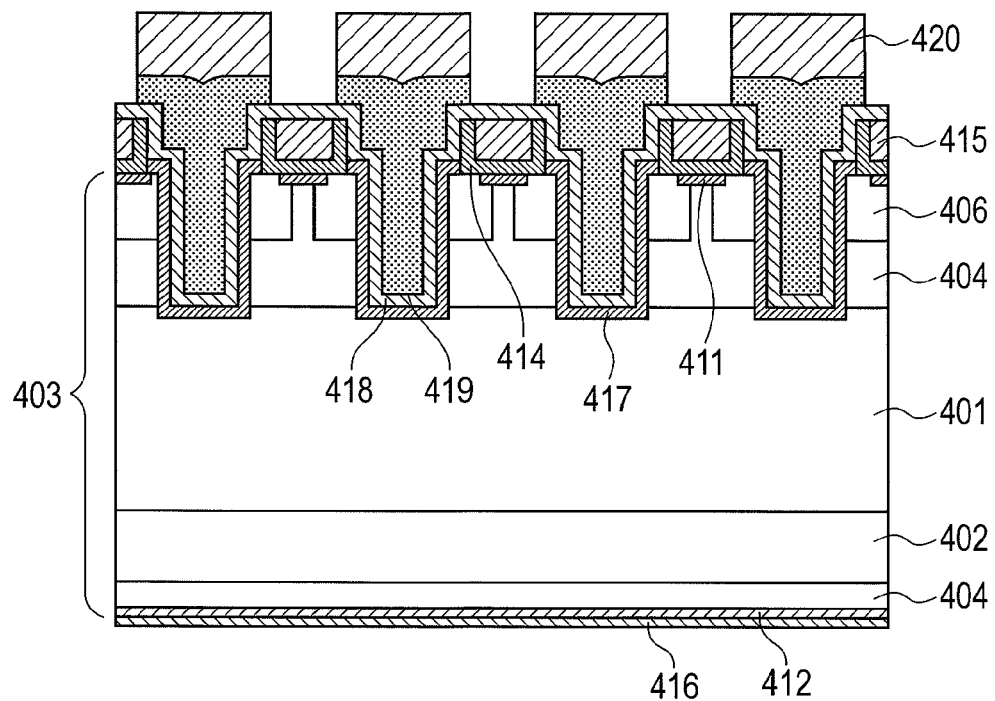
FIG. 4M is a cross sectional view of a step showing the step succeeding to FIG. 4L.
Figure 4N:
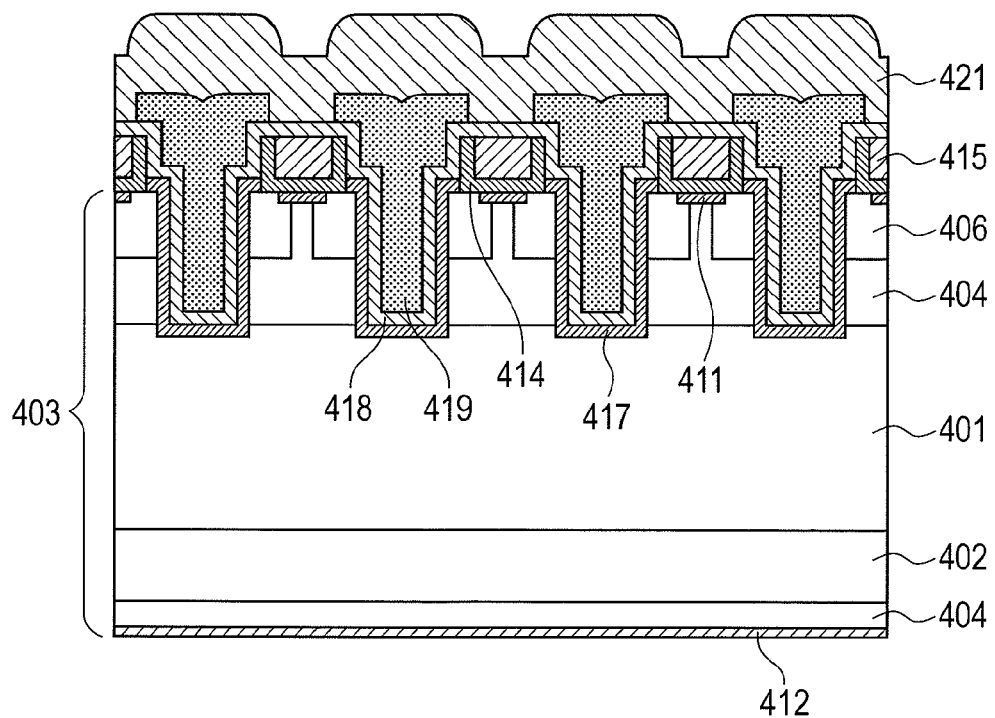
FIG. 4N is a cross sectional view of a step showing the step succeeding to FIG. 4M.
Figure 40:
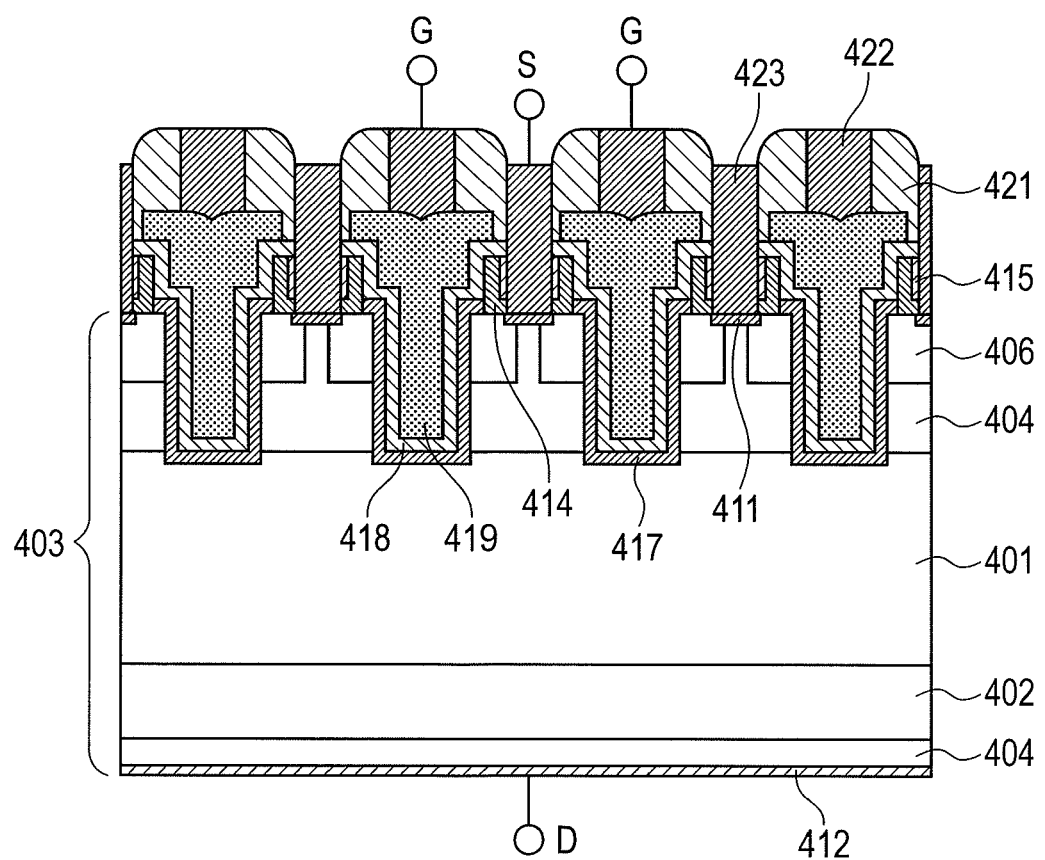

Successively, the steps identical with those in FIG. 2I to FIG. 2M described in the first embodiment are passed. At first, after pre-cleaning with HF diluted to a 1/100 concentration, a gate insulating film interface layer 417 is formed (FIG. 4K). Then, a gate insulating film 418 and a gate electrode 419 are formed (FIG. 4L). After forming the gate electrode 419, the gate electrode 419 is fabricated into a desired pattern (FIG. 4M). After fabricating the gate electrode 419, an interlayer film 421 is formed (FIG. 4N). After forming the interlayer film 421, the anti-oxidation film 416 for the metal silicide at the rearface of the SiC epitaxial substrate 403 is removed.

After removing the anti-oxidation film 416 for the metal silicide, the interlayer film 421, the insulating film 415, and the anti-oxidation film 414 for the metal silicide are apertured for forming the wiring electrodes to the gate electrode 419 and the metal silicide film 411 on the surface (FIG. 4O). Successively, the wiring electrode 422 to the gate and the wiring electrode 423 to the source are formed. The wiring electrodes 422 and 423 are fabricated into a desired shape and, by way of wiring steps, the gate wiring and source wiring of the unit cell are collected, for example, as shown in FIG. 2Q.

By way of the steps of the third embodiment described above, a metal silicide showing a good ohmic characteristic of $10^{-6}$ Ωcm$^2$ or less is formed in the trench type MOSFET, and high channel mobility can be obtained. By compatible low contact resistance and low channel resistance, a SiC semiconductor device decreasing the on resistance can be manufactured. Since effects identical with those in the first embodiment are obtained for other effects, they are not described herein. While the drawings show an example where the end of the metal silicide layer and the wider portion of the gate electrode do not overlap, they may also be overlapped. In the case of overlapping them, the third subject can be overcome and decrease in the resistance for the gate electrode and for the source region can be made compatible as the effect inherent to the trench type. Further, the step and the structure of providing the metal carbide layer can also be adopted as shown in FIG. 2O and FIG. 2P in which the same effect as shown in the first embodiment can be obtained.

What is claimed is:

1. A silicon carbide semiconductor device comprising:
    a silicon carbide semiconductor layer formed over a silicon carbide substrate;
    a metal silicide layer formed over the silicon carbide semiconductor layer except over a first region of the silicon carbide semiconductor layer;
    a contact plug formed over the metal silicide layer in a second region of the silicon carbide semiconductor layer;
    an anti-oxidation film for the metal silicide layer formed over the metal silicide layer except the second region where the contact plug has been formed, the anti-oxidation film extending so as to cover an edge of the metal silicide layer;
    a silicon oxide film formed over the anti-oxidation film;
    a gate electrode of a MOSFET formed in the first region;
    a gate insulating interface layer formed on the silicon carbide semiconductor layer;
    a gate insulating film disposed at a distance from the edge of the metal silicide layer, and formed between the gate insulating interface layer and the gate electrode; and
    a drain electrode of the MOSFET disposed on a surface of the silicon carbide substrate which is opposite the surface where the silicon carbide semiconductor layer is formed.

2. The silicon carbide semiconductor device according to claim 1,
    wherein the gate electrode is buried in a trench formed in the silicon carbide substrate.

3. The silicon carbide semiconductor device according to claim 2,
    wherein the gate electrode has a portion wider than the trench at the outside of the trench, and the edge of the metal silicide layer is formed nearer to the gate insulating film than an end of the wider portion.

4. The silicon carbide semiconductor device according to claim 1,
    wherein the anti-oxidation film comprises any of a silicon nitride film, an aluminum nitride film, a boron nitride film, and a silicon carbide film.

5. The silicon carbide semiconductor device according to claim 1,
    wherein a nitridation amount of the gate insulating film is in a range from 0.1 to 10%.

* * * * *